United States Patent
Zhang et al.

(10) Patent No.: US 12,169,425 B2
(45) Date of Patent: Dec. 17, 2024

(54) ROTATING MECHANISM, SUPPORT APPARATUS, AND ELECTRONIC DEVICE

(71) Applicant: Honor Device Co., Ltd., Shenzhen (CN)

(72) Inventors: Yaolei Zhang, Shenzhen (CN); Zhenbiao Fu, Shenzhen (CN); Haifei Li, Shenzhen (CN); Mingqian Gao, Shenzhen (CN); Bin Yan, Shenzhen (CN); Guotong Zhou, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 17/914,130

(22) PCT Filed: Apr. 26, 2022

(86) PCT No.: PCT/CN2022/089402
§ 371 (c)(1),
(2) Date: Sep. 23, 2022

(87) PCT Pub. No.: WO2022/247565
PCT Pub. Date: Dec. 1, 2022

(65) Prior Publication Data
US 2024/0211002 A1 Jun. 27, 2024

(30) Foreign Application Priority Data
May 27, 2021 (CN) .......................... 202110587689.2

(51) Int. Cl.
*G06F 1/16* (2006.01)
*H04M 1/02* (2006.01)
*H05K 5/02* (2006.01)

(52) U.S. Cl.
CPC .......... *G06F 1/1681* (2013.01); *G06F 1/1652* (2013.01); *H04M 1/022* (2013.01);
(Continued)

(58) Field of Classification Search
CPC .... G06F 1/1681; G06F 1/1652; G06F 1/1641; H04M 1/0268; H04M 1/022; H05K 5/0226
See application file for complete search history.

(56) References Cited

U.S. PATENT DOCUMENTS 9,848,502 B1 * 12/2017 Chu ....................... G06F 1/1681
10,036,188 B1 * 7/2018 Yao ....................... H05K 5/0226
(Continued)

FOREIGN PATENT DOCUMENTS

CN 109936648 A 6/2019
CN 110428730 A 11/2019
(Continued)

*Primary Examiner* — Nidhi Thaker
(74) *Attorney, Agent, or Firm* — Leydig, Voit & Mayer, Ltd.

(57) ABSTRACT

Disclosed are a rotating mechanism, a support apparatus, and an electronic device. The rotating mechanism includes a base, a first door panel, a first connector, and a first swing arm. The first door panel is hinged to the base, the first connector is hinged to the first door panel. The base is further configured to connect a second housing. The first door panel is provided with a first guide sliding slot; and the first connector is provided with a second guide sliding slot. One end of the first swing arm is hinged to the base, the other end of the first swing arm is provided with a first sliding member, and the first sliding member is slidably connected inside the first guide sliding slot and the second guide sliding slot.

16 Claims, 19 Drawing Sheets

(52) U.S. Cl.
CPC ......... *H04M 1/0268* (2013.01); *G06F 1/1641* (2013.01); *H05K 5/0226* (2013.01)

(56) References Cited

U.S. PATENT DOCUMENTS

| | | | |
|---|---|---|---|
| 10,761,573 B2 * | 9/2020 | Hsu | G06F 1/1681 |
| 10,761,574 B1 * | 9/2020 | Hsu | G06F 1/1616 |
| 10,824,197 B1 * | 11/2020 | Hsu | G06F 1/1641 |
| 10,845,850 B1 * | 11/2020 | Kang | E05D 3/122 |
| 11,395,424 B2 | 7/2022 | Nagai et al. | |
| 11,516,932 B2 * | 11/2022 | Sim | H05K 5/0017 |
| 12,058,826 B2 * | 8/2024 | Feng | H05K 5/0226 |
| 2021/0165466 A1 * | 6/2021 | Kang | G06F 1/1616 |
| 2021/0271294 A1 * | 9/2021 | Liao | G06F 1/1681 |
| 2022/0365568 A1 * | 11/2022 | Torres | E05D 3/16 |
| 2022/0413562 A1 * | 12/2022 | Kim | H04M 1/0216 |
| 2023/0409090 A1 * | 12/2023 | Hong | G06F 1/1681 |
| 2024/0080382 A1 * | 3/2024 | Huang | H04M 1/022 |

FOREIGN PATENT DOCUMENTS

| | | |
|---|---|---|
| CN | 209657193 U | 11/2019 |
| CN | 110675746 A | 1/2020 |
| CN | 211296753 U | 8/2020 |
| CN | 111614806 A | 9/2020 |
| CN | 111627329 A | 9/2020 |
| CN | 112243053 A | 1/2021 |
| WO | 2020240712 A1 | 12/2020 |

* cited by examiner

ROTATING MECHANISM, SUPPORT APPARATUS, AND ELECTRONIC DEVICE

CROSS-REFERENCE TO RELATED APPLICATIONS

This application is a national stage of International Application No. PCT/CN2022/089402, filed on Apr. 26, 2022, which claims priority to Chinese Patent Application No. 202110587689.2, filed on May 27, 2021. Both of the aforementioned applications are hereby incorporated by reference in their entireties.

TECHNICAL FIELD

This application relates to the technical field of electronic devices, and in particular, to a rotating mechanism, a support apparatus, and an electronic device.

BACKGROUND

With the development of technologies of foldable screens, a mobile phone with a foldable screen has become a hotspot technology. Existing folding manners include inward folding and outward folding, that is, a screen is disposed inside or outside after being folded. A problem with outward folding is that the screen is exposed, and may be easily scratched by a hard object.

Currently, a folding mechanism configured to implement inward folding of a foldable screen has a complex structure and excessive parts, and folds the foldable screen at a large inward folding angle (that is, an R angle) by using a complicated rotating mechanism, so as to prevent the foldable screen from being damaged. However, complexity of the mechanism and components makes folding unstable and prone to errors.

SUMMARY

Embodiments of this application provide a rotating mechanism, a support apparatus, and an electronic device, which can fold a foldable region of a foldable screen into a water drop shape when the foldable region is in a folded state, thereby increasing a folding R angle and prolonging a service life of the foldable screen.

To achieve the foregoing objective, the following technical solutions are used in the embodiments of this application:

According to a first aspect, some embodiments of this application provide a rotating mechanism, where the rotating mechanism includes a base, a first door panel, a first connector, and a first swing arm. The first door panel is hinged to the base, and the first connector is hinged to the first door panel. The first connector is configured to be fixed to a first housing. The first door panel is provided with a first guide sliding slot. The first connector is provided with a second guide sliding slot. One end of the first swing arm is hinged to the base, the other end of the first swing arm is provided with a first sliding member, and the first sliding member is slidably connected inside the first guide sliding slot and the second guide sliding slot. The base, the first door panel, and the first housing each have a lamination surface, and the lamination surface is used for lamination to a foldable screen. The first connector is capable of rotating between an unfolding position and a folding position relative to the base. When the first connector is at the unfolding position, the lamination surface of the base, the lamination surface of the first door panel, and the lamination surface of the first housing are coplanar and face a same direction. When the first connector is at the folding position, an included angle between the lamination surface of the base and the lamination surface of the first door panel on a side for lamination to the foldable screen is α, where α is less than 90°; an included angle between the lamination surface of the first door panel and the lamination surface of the first housing on the side for lamination to the foldable screen is β, where β is greater than 180°; and the lamination surface of the first housing is perpendicular or approximately perpendicular to the lamination surface of the base.

In the support apparatus according to this embodiment, the foldable screen part attached to the lamination surface of the base, the lamination surface of the first door panel, and the lamination surface of the first housing may be folded into a water drop shape, so as to increase an R angle of the foldable screen in a bent region, thereby prolonging a service life of the foldable screen.

In a possible implementation of the first aspect, α is greater than or equal to 650 and less than or equal to 82°. In this way, the included angle between the lamination surface of the base and the lamination surface of the first door panel is moderate, which can increase the R angle of the foldable screen in the bent region and effectively prolong the service life of the foldable screen.

In a possible implementation of the first aspect, a hinge axis between the first door panel and the base is a first hinge axis, the first hinge axis is located on the side which the lamination surface of the base faces, and the first hinge axis is spaced from the lamination surface of the base. In this way, when the first connector rotates from the unfolding position to the folding position, the base may be sunk to avoid the foldable screen, so that the foldable screen has a relatively large inward folding angle, and the service life of the foldable screen can be prolonged. When the first connector rotates from the folding position to the unfolding position, the base may be lifted, so that the lamination surface of the base is flush with the lamination surface of the first door panel and the lamination surface of the first housing, to ensure that the foldable screen is flat.

In a possible implementation of the first aspect, a hinge axis between the first connector and the first door panel is a second hinge axis, and the second hinge axis coincides with an edge of the lamination surface of the first door panel close to the lamination surface of the first housing. In this way, when the first connector moves between the unfolding position and the folding position, a relative position between the edge of the lamination surface of the first door panel close to the lamination surface of the first housing and the lamination surface of the first housing is fixed, so that the foldable screen is not damaged, thereby prolonging the service life of the foldable screen.

In a possible implementation of the first aspect, the first guide sliding slot and the second guide sliding slot are located on a side of the lamination surface of the first door panel away from the foldable screen. An orthographic projection of the first guide sliding slot on the lamination surface of the first door panel is a first projection, an orthographic projection of the second guide sliding slot on the lamination surface of the first door panel is a second projection, an edge of the lamination surface of the first door panel close to the lamination surface of the base is a first edge, an edge of the lamination surface of the first door panel close to the lamination surface of the first housing is a second edge, and the first projection and the second projection are located between a straight line at which the first edge is located and a straight line at which the second edge is located. In this way, the rotating mechanism has a simple structure and a relatively small volume. In addition, the first guide sliding slot and the second guide sliding slot do not interfere with the foldable screen.

In a possible implementation of the first aspect, two ends of the first guide sliding slot are a first end and a second end respectively, and the first guide sliding slot extends from the first end to the second end in a direction close to the base. Two ends of the second guide sliding slot are a third end and a fourth end respectively, and the second guide sliding slot extends from the third end to the fourth end in a direction close to the base. When the first connector rotates from the unfolding position to the folding position, the first sliding member slides from the first end of the first guide sliding slot and the third end of the second guide sliding slot to the second end of the first guide sliding slot and the fourth end of the second guide sliding slot. In this way, the first connector can rotate from the unfolding position to the folding position more smoothly, and it is easier to unfold and fold the electronic device.

In a possible implementation of the first aspect, the second guide sliding slot extends from the third end to the fourth end in a direction away from a plane at which the lamination surface of the first housing is located. That is, a perpendicular distance between different parts of the second guide sliding slot from the third end to the fourth end and the plane at which the lamination surface of the first housing is located gradually increases. In this way, during rotation of the first connector from the unfolding position to the folding position, the second guide sliding slot may push the first sliding member to gradually move in a direction away from the foldable screen, thereby driving one end of the first door panel close to the base to be gradually inclined in a direction away from the foldable screen relatively to the other end of the first door panel close to the first connector. In this way, the first connector gradually rotates to the folding position. The structure is simple, and a driving force applied to the first housing can be directly transmitted to the first sliding member to push the first door panel to slantly move, so that the folding driving force of the electronic device is relatively strong, and a probability of jamming is relatively low.

In a possible implementation of the first aspect, the second guide sliding slot is an arc-shaped sliding slot, and an extension path of the second guide sliding slot is arched in a direction close to the lamination surface of the first door panel. In this way, during the rotation of the first connector from the unfolding position to the folding position, the second guide sliding slot may control an inclination angle of the first door panel to change smoothly, thereby improving folding stability of the electronic device and reducing the probability of jamming.

In a possible implementation of the first aspect, the first guide sliding slot is an arc-shaped sliding slot, and an extension path of the first guide sliding slot is arched in a direction away from the lamination surface of the first door panel. In this way, during the rotation of the first connector from the unfolding position to the folding position, the second guide sliding slot matches the first guide sliding slot, so that the inclination angle of the first door panel may be controlled to change gently, and stress is stable, thereby further improving folding stability of the electronic device and reducing the probability of jamming.

In a possible implementation of the first aspect, the first guide sliding slot and the second guide sliding slot each have a length range of [3.5 mm, 10 mm] along an extension path thereof. Further, optionally, the first guide sliding slot and the second guide sliding slot each have a length range of [3.5 mm, 5 mm] along an extension path thereof.

In a possible implementation of the first aspect, the first guide sliding slot and the second guide sliding slot each have a curvature radius range of [3 mm, 7 mm] at each position on the extension path thereof. Further, optionally, the first guide sliding slot and the second guide sliding slot each have a curvature radius range of [4 mm, 5.5 mm] at each position on the extension path thereof.

In a possible implementation of the first aspect, a hinge axis between the first connector and the first door panel is a second hinge axis. When the first connector is at the unfolding position, an included angle between a vertical line from the second end of the first guide sliding slot to the second hinge axis and a vertical line from the fourth end of the second guide sliding slot to the second hinge axis is γ, and γ=90°−α=β−180°.

In a possible implementation of the first aspect, the base is provided with a first hinge slot, and a first arc-shaped rib is arranged in the first hinge slot. The first door panel is provided with a first hinge block, and the first hinge block is provided with a first arc-shaped elongated slot. The first hinge block is matched and accommodated in the first hinge slot, and the first arc-shaped rib is matched and embedded in the first arc-shaped elongated slot. Therefore, hinging between the base and the first door panel is implemented.

In a possible implementation of the first aspect, the first door panel is provided with a second hinge block, and the second hinge block is provided with a second arc-shaped elongated slot. The first connector is provided with a second hinge slot, and a second arc-shaped rib is arranged in the second hinge slot. The second hinge block is matched and accommodated in the second hinge slot, and the second arc-shaped rib is matched and accommodated in the second arc-shaped elongated slot. Therefore, hinging between the first connector and the first door panel is implemented.

In a possible implementation of the first aspect, the rotating mechanism further includes a second door panel, a second connector, and a second swing arm. The second door panel is hinged to the base, the second connector is hinged to the second door panel, and the second connector is configured to be fixed to a second housing. The second door panel is provided with a third guide sliding slot. The second connector is provided with a fourth guide sliding slot. One end of the second swing arm is hinged to the base, the other end of the second swing arm is provided with a second sliding member, and the second sliding member is slidably connected inside the third guide sliding slot and the fourth guide sliding slot. The second door panel and the second housing each have a lamination surface, and the lamination surface is used for lamination to the foldable screen. The second connector is capable of rotating between an unfolding position and a folding position relative to the base. When the second connector is at the unfolding position, the lamination surface of the base, the lamination surface of the second door panel, and the lamination surface of the second housing are coplanarly disposed and face a same direction. When the second connector is at the folding position, an included angle between the lamination surface of the base and the lamination surface of the second door panel on a side for lamination to the foldable screen is less than 90°, an included angle between the lamination surface of the second door panel and the lamination surface of the second housing on a side for lamination to the foldable screen is greater than 180°, and the lamination surface of the second housing is perpendicular or approximately perpendicular to the lamination surface of the base. In this way, when the support apparatus is in a folded state, the foldable screen part (that is, a third part described below) supported on the rotating mechanism may be in a water drop shape, so that the inward folding angle of the foldable screen can be increased, and the service life of the foldable screen is prolonged.

According to a second aspect, some embodiments of this application provide a support apparatus. The support apparatus includes a first housing, a second housing, and the rotating mechanism according to any one of the foregoing technical solutions, where the rotating mechanism is located between the first housing and the second housing, a first connector of the rotating mechanism is fixed to the first housing, and the base of the rotating mechanism is further connected to the second housing.

Because the support apparatus according to the embodiments of this application includes the rotating mechanism according to any one of the foregoing technical solutions, the support apparatus and the rotating mechanism can resolve a same technical problem and achieve a same effect.

According to a third aspect, some embodiments of this application provide an electronic device. The electronic device includes a foldable screen and the support apparatus according to the foregoing technical solutions. The foldable screen includes a first part, a second part, and a bent part, where the bent part is located between the first part and the second part, the first part is supported and fixed to a first housing, the second part is supported and fixed to a second housing, and the bent part is supported on a rotating mechanism of the support apparatus.

Because the electronic device according to the embodiments of this application includes the support apparatus according to the foregoing technical solutions, the support apparatus and the rotating mechanism can resolve a same technical problem and achieve a same effect.

DESCRIPTION OF EMBODIMENTS

In embodiments of this application, the terms "first", "second", "third", and "fourth" are used for descriptive purposes only, and cannot be construed as indicating or implying relative importance or implicitly indicating the quantity of technical features indicated. Therefore, the features defined with "first", "second", "third", and "fourth" may explicitly or implicitly include one or more of the features.

In the embodiments of this application, the term "including", "containing" or any other variant thereof is intended to cover non-exclusive inclusion, so that a process, method, article or apparatus including a series of elements includes not only those elements, but also other elements not explicitly listed, or elements inherent to such a process, method, article or apparatus. Without further limitation, the element defined by the sentence "including a . . . " does not exclude that other identical elements are also present in the process, method, article or apparatus including the element.

This application provides an electronic device. The electronic device is an electronic device with a foldable screen. Specifically, the electronic device includes, but is not limited to, a mobile phone, a tablet personal computer, a laptop computer, a personal digital assistant (PDA), a personal computer, a notebook computer, a vehicle-mounted device, and a wearable device (such as a watch).

Figure 1:
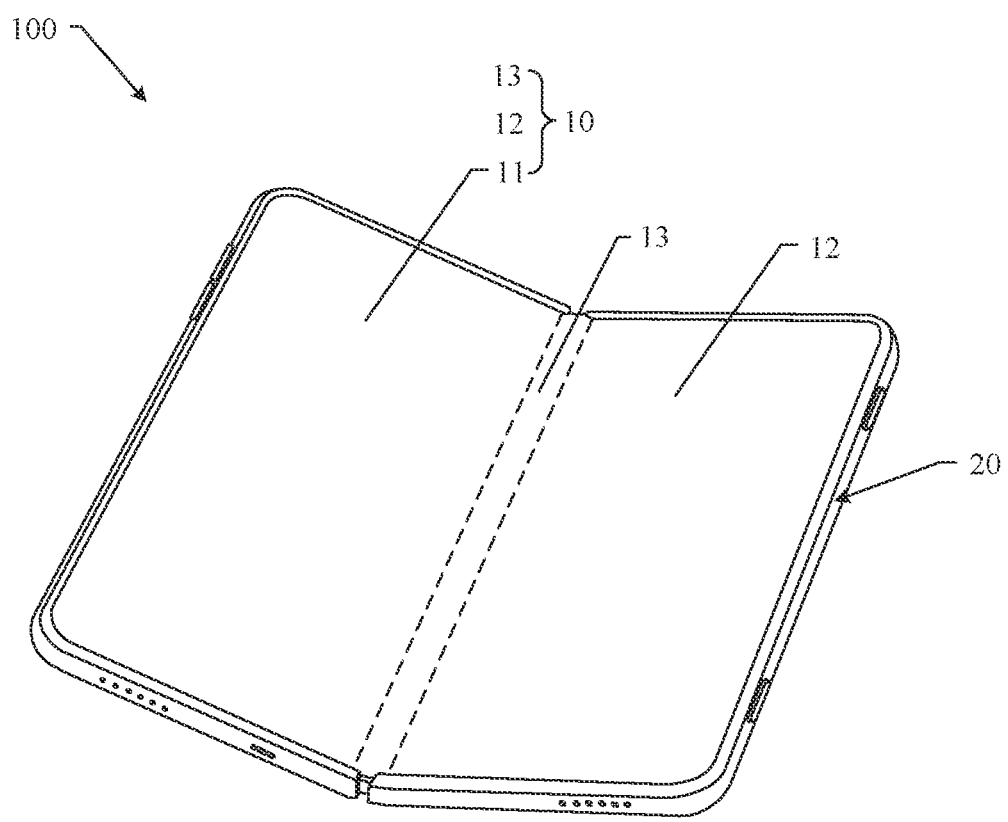
FIG. 1 is a perspective view of an electronic device according to some embodiments of this application.

FIG. 1 is a perspective view of an electronic device 100 according to some embodiments of this application. In this embodiment, the electronic device 100 is a mobile phone with a foldable screen. The electronic device 100 includes a foldable screen 10 and a support apparatus 20. It may be understood that FIG. 1 shows only an example of some components included in the electronic device 100, and actual shapes, actual sizes, actual positions, and actual structures of these components are not limited by FIG. 1.

The foldable screen 10 is configured to display an image, a video, and the like. The foldable screen 10 may be folded into a first part 11 and a second part 12. The foldable screen 10 further includes a third part 13 located between the first part 11 and the second part 12. At least the third part 13 of the foldable screen 10 is made of a flexible material. The first part 11 and the second part 12 may be made of a flexible material, or may be made of a rigid material, or part of the first part 11 and the second part 12 is made of a rigid material, and the other part thereof is made of a flexible material. This is not specifically limited herein.

Specifically, the foldable screen 10 may be an organic light-emitting diode (OLED) screen, a micro organic light-emitting diode screen, a quantum dot light emitting diodes (QLED) screen, a liquid crystal display (LCD), or the like.

The foldable screen 10 can be switched between an unfolded state and a folded state.

Figure 2:
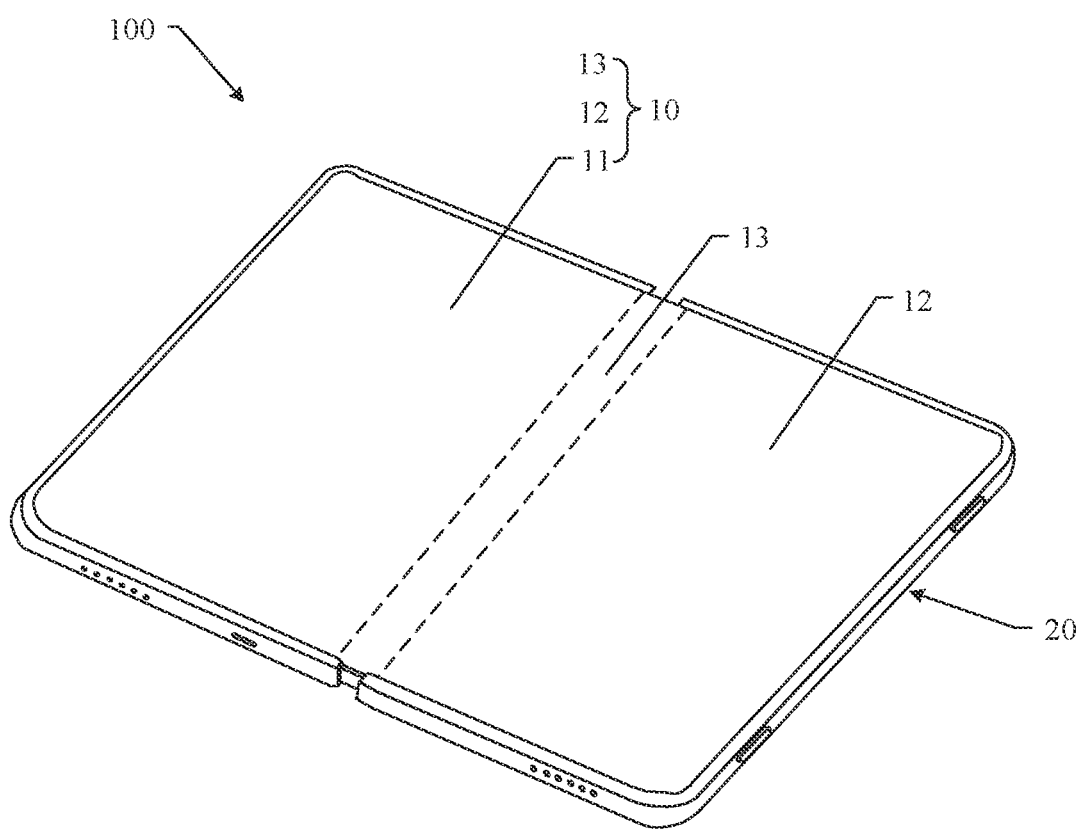
FIG. 2 is a schematic diagram of a structure of the electronic device shown in FIG. 1 when a foldable screen is in an unfolded state.

FIG. 2 is a schematic diagram of a structure of the electronic device 100 shown in FIG. 1 when a foldable screen 10 is in an unfolded state. When the foldable screen 10 is in the unfolded state, the first part 11, the second part 12, and the third part 13 are coplanarly disposed and face a same direction. In this state, large-screen display can be implemented, which can provide richer information to a user and bring better use experience to the user.

Figure 3:
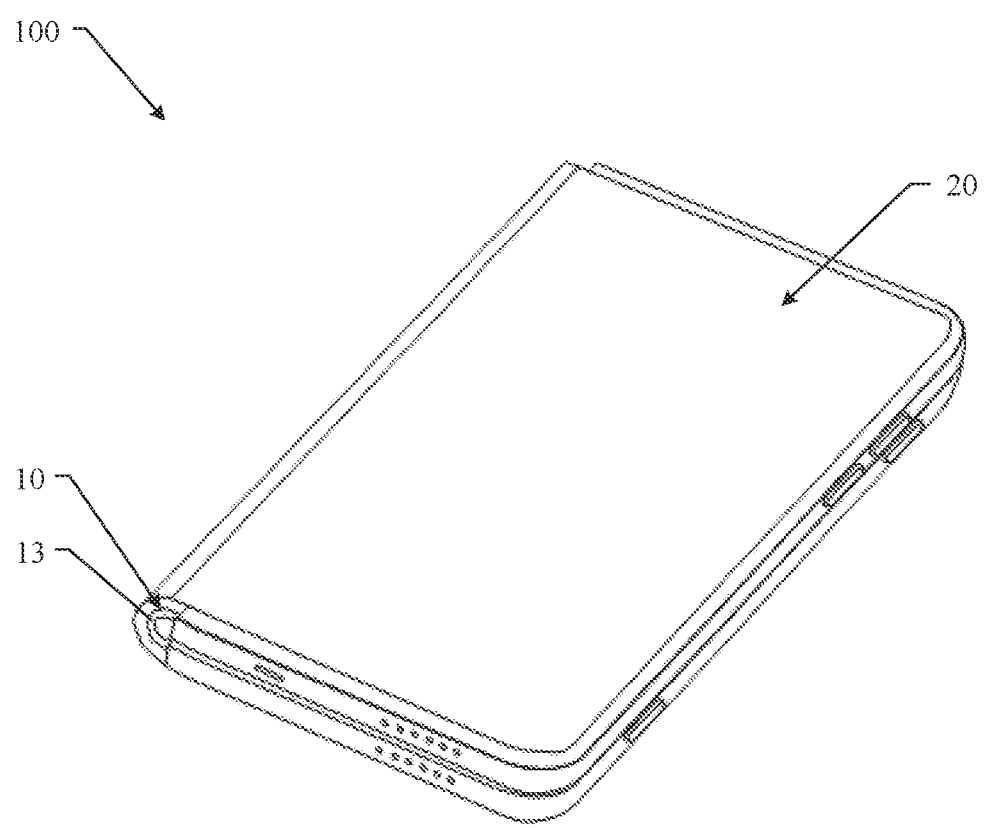
FIG. 3 is a schematic diagram of a structure of the electronic device shown in FIG. 1 when the foldable screen is in a folded state.

FIG. 3 is a schematic diagram of a structure of the electronic device 100 shown in FIG. 1 when a foldable screen 10 is in a folded state. When the foldable screen 10 is in the folded state, the third part 13 is in a bent state, and the first part (not shown in FIG. 3) is opposite to the second part (not shown in FIG. 3). The foldable screen 10 is invisible to the user, and the support apparatus 20 is protected outside the foldable screen 10 to prevent the foldable screen 10 from being scratched by a hard object.

Figure 4:
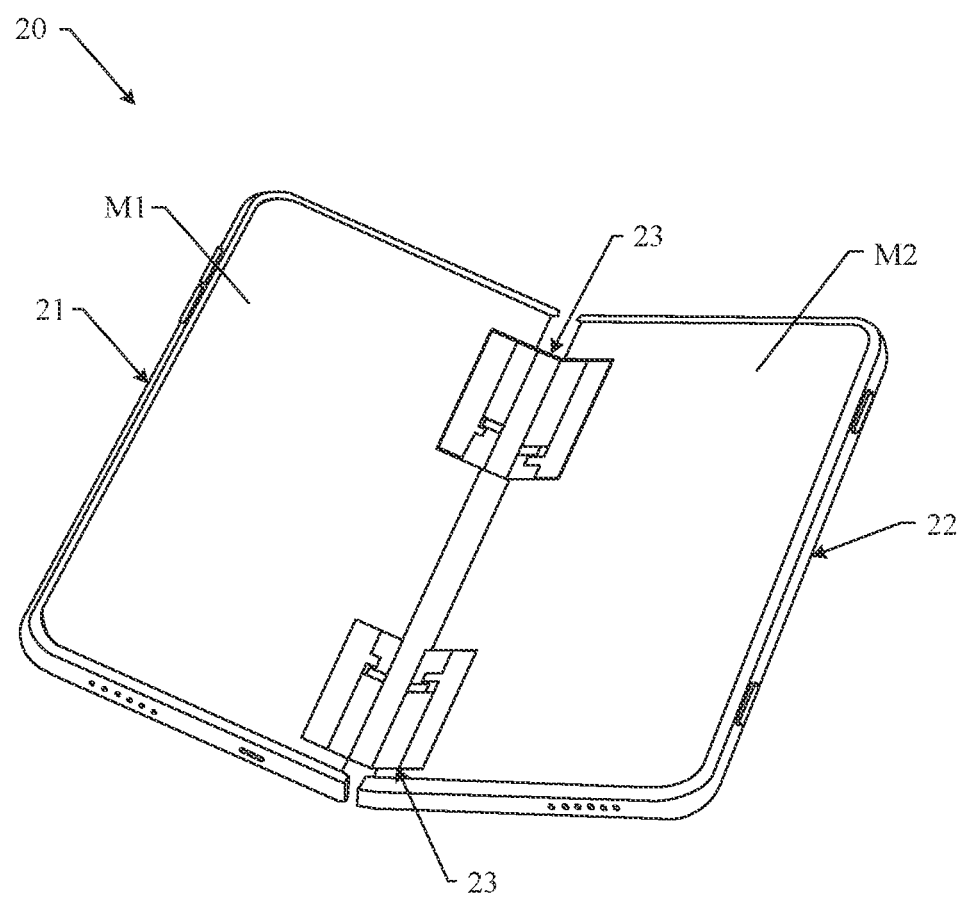
FIG. 4 is a perspective view of a support apparatus in the electronic device shown in FIG. 1.

The support apparatus 20 is configured to support the foldable screen 10 and allow the foldable screen 10 to be switched between an unfolded state and a folded state. FIG. 4 is a perspective view of a support apparatus 20 in the electronic device 100 shown in FIG. 1. In this embodiment, the support apparatus 20 includes a first housing 21, a second housing 22, and a rotating mechanism 23. It may be understood that FIG. 4 shows only an example of some components included in the support apparatus 20, and actual shapes, actual sizes, actual positions, and actual structures of these components are not limited by FIG. 4.

The first housing 21 is configured to fix and support the first part 11 of the foldable screen 10 in FIG. 1. Specifically, the first housing 21 has a lamination surface M1, and the first housing 21 is configured to fix and support the first part 11 of the foldable screen 10 in FIG. 1 by using the lamination surface M1.

The second housing 22 is configured to fix and support the second part 12 of the foldable screen 10 in FIG. 1. Specifically, the second housing 22 has a lamination surface M2, and the second housing 22 is configure to fix and support the second part 12 of the foldable screen 10 in FIG. 1 by using the lamination surface M2.

A first accommodating cavity (not shown in the figure) is formed inside the first housing 21. A second accommodating cavity (not shown in the figure) is formed inside the second housing 22. The first accommodating cavity and the second accommodating cavity are configured to accommodate electronic devices such as a mainboard, a battery, a camera module, a speaker, and an earpiece of the electronic device 100.

The first housing 21 may be of an integral structure, or may be formed by assembling a plurality of parts. Similarly, the second housing 22 may be an integral mechanical part or may be formed by assembling a plurality of parts.

Figure 5:
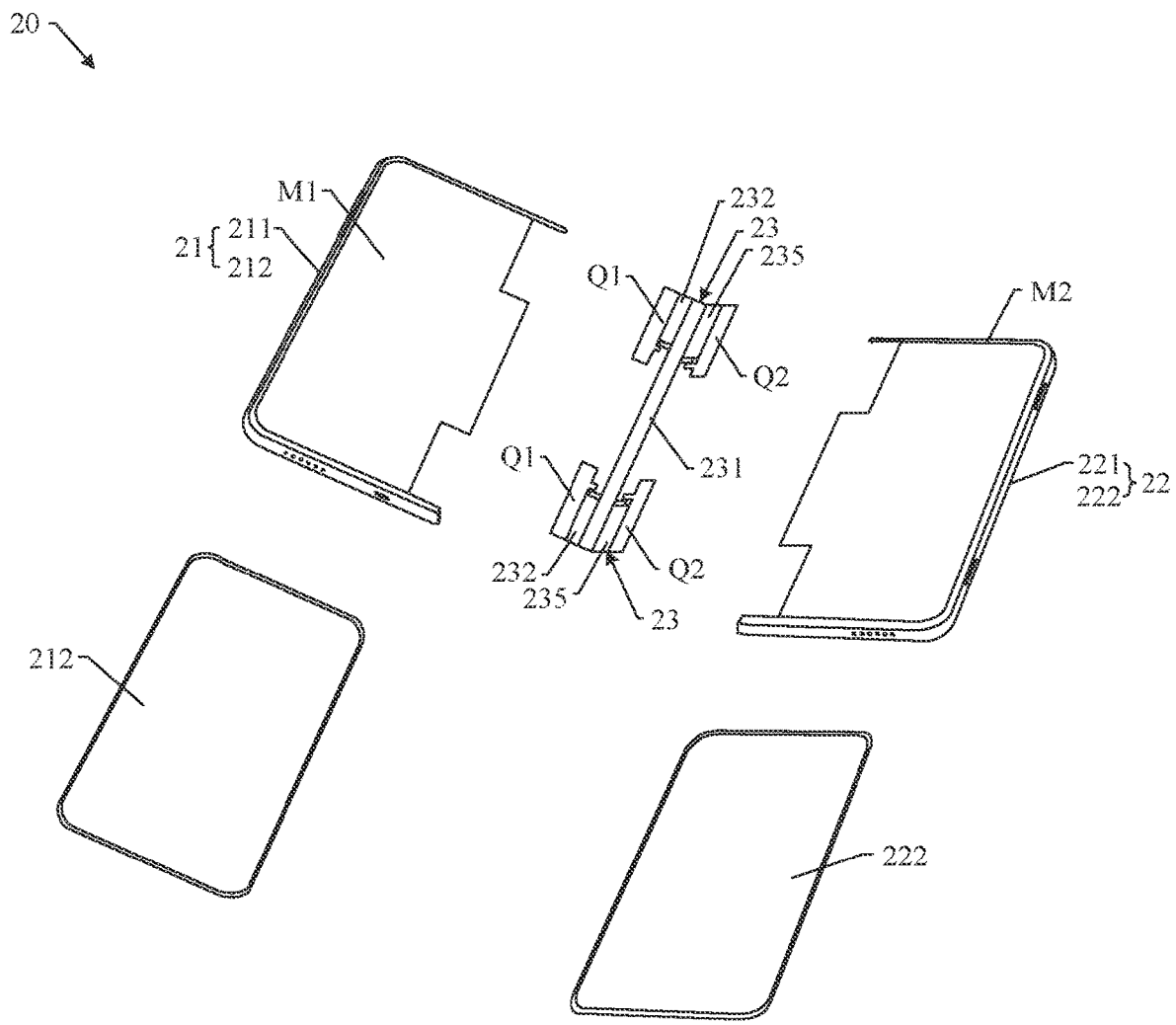
FIG. 5 is a partial exploded view of the support apparatus shown in FIG. 4.

In some embodiments, FIG. 5 is an exploded view of the support apparatus 20 shown in FIG. 4. A first housing 21 includes a first middle frame 211 and a first back cover 212. A lamination surface M1 is located on the first middle frame 211. The first back cover 212 is fixed to a side of the first middle frame 211 that faces away from the lamination surface M1. The first accommodating cavity is formed between the first middle frame 211 and the first back cover 212.

The second housing 22 includes a second middle frame 221 and a second back cover 222. A lamination surface M2 is located on the second middle frame 221. The second back cover 222 is fixed to a side of the second middle frame 221 that faces away from the lamination surface M2. The second accommodating cavity is formed between the second middle frame 221 and the second back cover 222.

The rotating mechanism 23 is configured to support the third part 13 of the foldable screen 10. In addition, the rotating mechanism 23 is connected between the first housing 21 and the second housing 22, and the first housing 21 is rotatably connected to the second housing 22 by using the rotating mechanism 23. In some embodiments, the rotating mechanism 23 is connected between the first middle frame 211 of the first housing 21 and the second middle frame 221 of the second housing 22. In another embodiment, the rotating mechanism 23 may alternatively be connected between the first back cover 212 of the first housing 21 and the second back cover 222 of the second housing 22.

One, two or more rotating mechanisms 23 may be provided. FIG. 4 and FIG. 5 show only an example in which two rotating mechanisms 23 are provided. This should not be considered as a special limitation to this application. The two rotating mechanisms 23 are spaced from each other in a length direction of a folding axis of the foldable screen 10.

Figure 6:
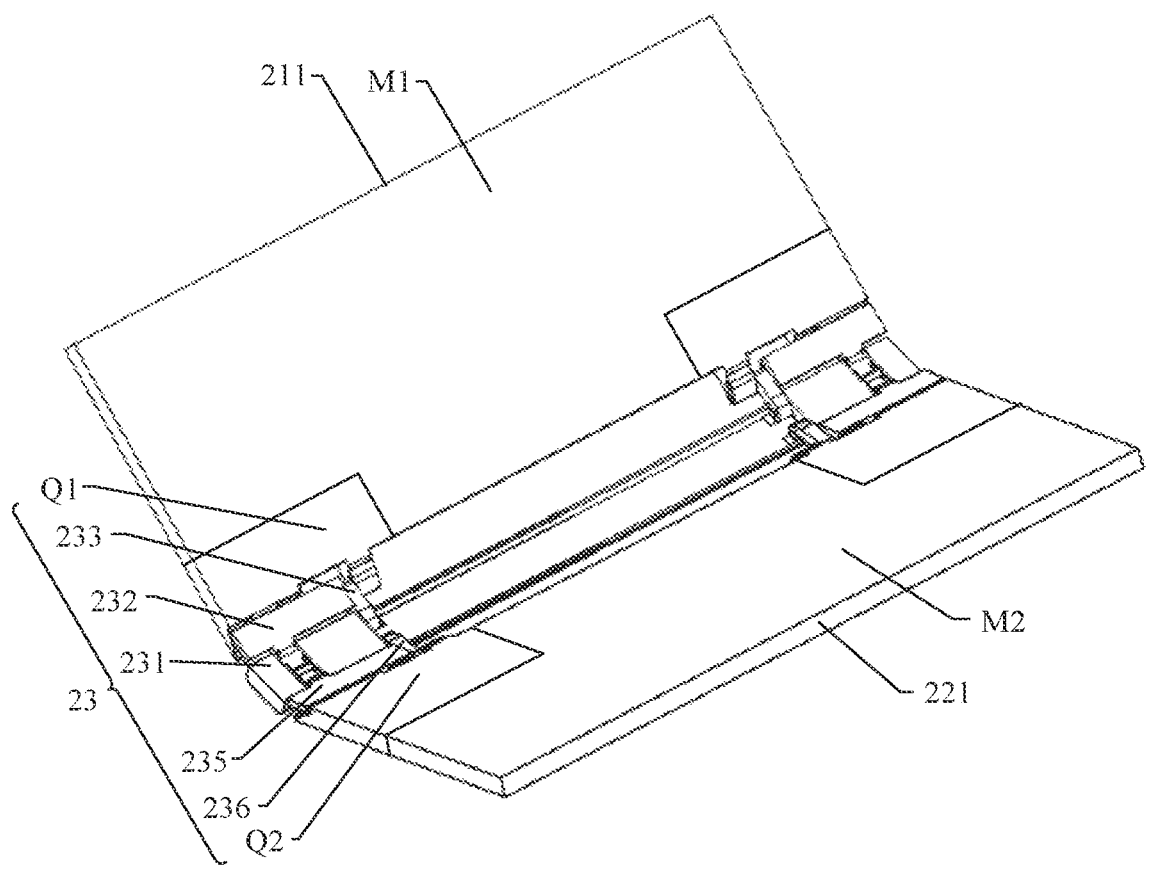
FIG. 6 is a schematic diagram of an assembly structure of a first middle frame, a rotating mechanism, and a second middle frame in a support apparatus according to some embodiments of this application.

FIG. 6 is a schematic diagram of an assembly structure of a first middle frame 211, a rotating mechanism 23, and a second middle frame 221 in a support apparatus 20 according to some embodiments of this application. In this embodiment, the rotating mechanism 23 includes a base 231, a first door panel 232, a first connector Q1, and a first swing arm 233. It may be understood that FIG. 6 shows only an example of some components included in the rotating mechanism 23, and actual shapes, actual sizes, actual positions, and actual structures of these components are not limited by FIG. 6.

Figure 7:
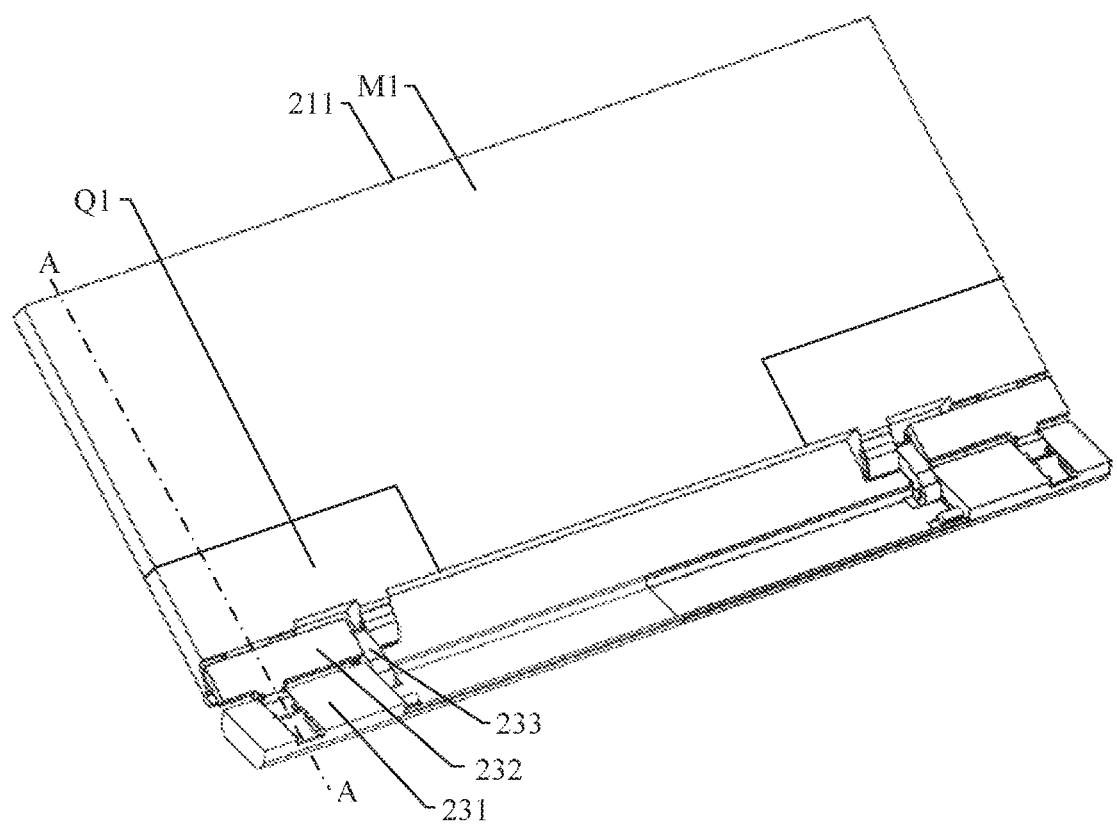
FIG. 7 is a schematic diagram of an assembly structure of the first middle frame, a base, a first door panel, a first connector, and a first swing arm in the assembly structure shown in FIG. 6.
Figure 8:
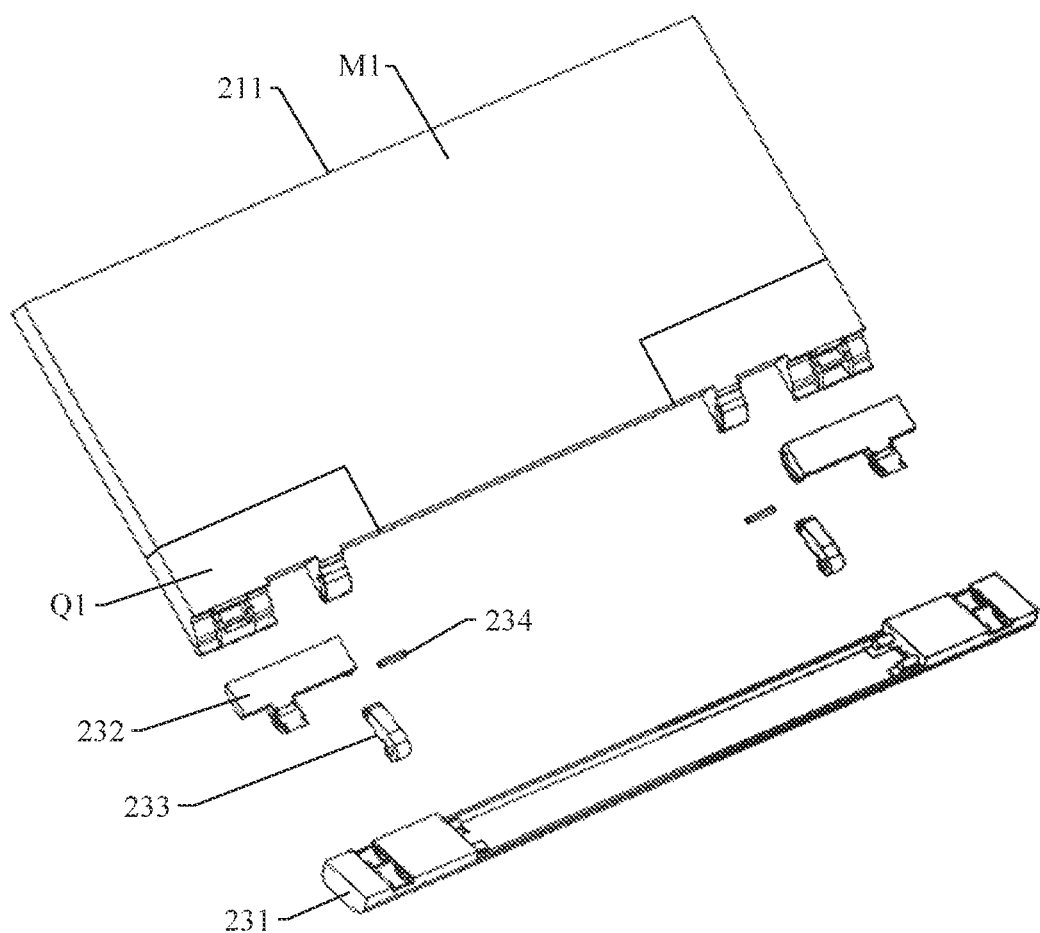
FIG. 8 is an exploded view of the assembly structure shown in FIG. 7.

FIG. 7 is a schematic diagram of an assembly structure of the first middle frame 211, the base 231, the first door panel 232, the first connector Q1, and the first swing arm 233 in the assembly structure shown in FIG. 6, and FIG. 8 is an exploded view of the assembly structure shown in FIG. 7. The first door panel 232 is hinged to the base 231.

Figure 9:
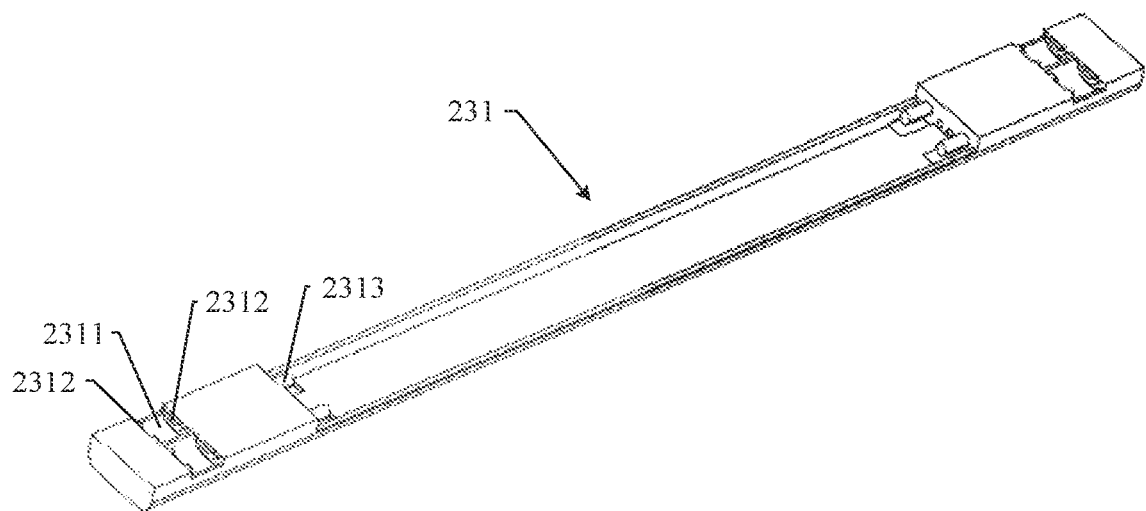
FIG. 9 is a schematic diagram of a structure of the base in the assembly structure shown in FIG. 7.

In some embodiments, FIG. 9 is a schematic diagram of a structure of the base 231 in the assembly structure shown in FIG. 7. In this embodiment, the base 231 is provided with a first hinge slot 2311. An inner wall of the first hinge slot 2311 is provided with a first arc-shaped rib 2312. An extension path of the first arc-shaped rib 2312 may be a major arc (that is, an arc with a central angle greater than 180°), a minor arc (that is, an arc with a central angle less than 180°), or a semi-circular arc (that is, an arc with a central angle equal to 180°). This is not specifically limited herein. In the embodiment shown in FIG. 9, the extension path of the first arc-shaped rib 2312 is a minor arc. In some embodiments, two first arc-shaped ribs 2312 are provided, the two first arc-shaped ribs 2312 are disposed on two opposite inner walls of the first hinge slot 2311 respectively, and circle center lines of the two first arc-shaped ribs 2312 are collinear. In another embodiment, one first arc-shaped rib 2312 may be provided. The base 231 is further provided with a hinge shaft 2313, and the hinge shaft 2313 is parallel to the circle center line of the first arc-shaped rib 2312.

Figure 10:
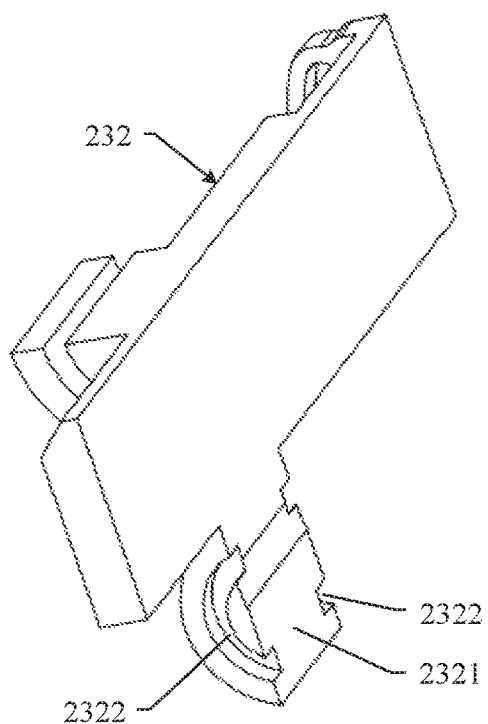
FIG. 10 is a schematic diagram of a structure of the first door panel in the assembly structure shown in FIG. 7.

FIG. 10 is a schematic diagram of a structure of the first door panel 232 in the assembly structure shown in FIG. 7. In this embodiment, the first door panel 232 is provided with a first hinge block 2321. The first hinge block 2321 may be fixed to the first door panel 232 through gluing, or may be integrally formed with the first door panel 232, that is, the first hinge block 2321 and the first door panel 232 are an integral mechanical part. The first hinge block 2321 is provided with a first arc-shaped elongated slot 2322. In some embodiments, two first arc-shaped elongated slots 2322 are provided, the two first arc-shaped elongated slots 2322 are disposed on two opposite side walls of the first hinge block 2321 respectively, and the circle center lines of the two first arc-shaped elongated slots 2322 are collinear. In another embodiment, one first arc-shaped elongated slot 2322 may be provided.

The first hinge block 2321 in FIG. 10 is matched and accommodated in the first hinge slot 2311 in FIG. 9, and can rotate around the circle center line of the first arc-shaped rib 2312 in the first hinge slot 2311. The two first arc-shaped ribs 2312 in FIG. 9 are matched and accommodated in the two first arc-shaped elongated slots 2322 in FIG. 10 respectively. Therefore, hinging between the first door panel 232 and the base 231 is implemented. This structure is simple and easy to implement.

In the foregoing embodiment, the first arc-shaped elongated slot 2322 may alternatively be disposed in the inner wall of the first hinge slot 2311, and the first arc-shaped rib 2312 may alternatively be disposed on the first hinge block 2321. This is not specifically limited herein.

The first connector Q1 is hinged to the first door panel 232.

Figure 11:
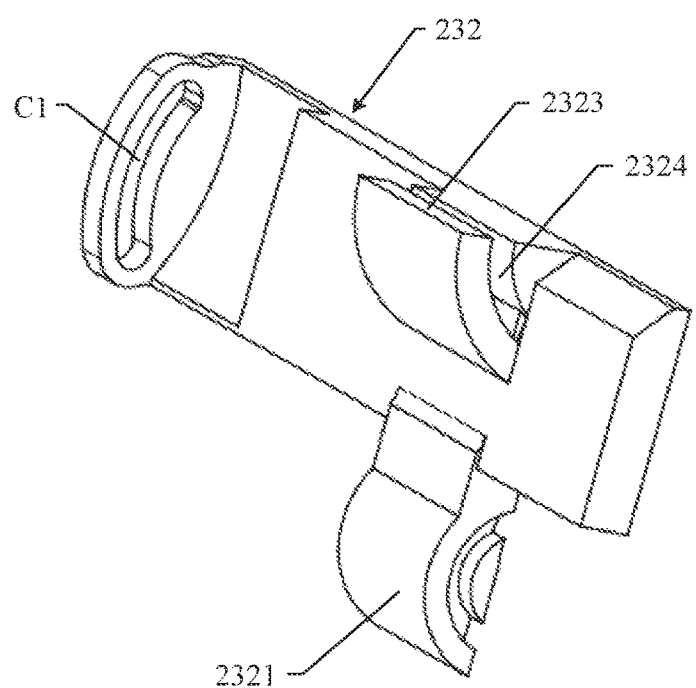
FIG. 11 is a schematic diagram of a structure of the first door panel shown in FIG. 10 at another view angle.

In some embodiments, FIG. 11 is a schematic diagram of a structure of the first door panel 232 shown in FIG. 10 at another view angle. In this embodiment, the first door panel 232 is provided with a second hinge block 2323. The second hinge block 2323 may be fixed to the first door panel 232 through gluing, or may be integrally formed with the first door panel 232, that is, the second hinge block 2323 and the first door panel 232 are an integral mechanical part. The second hinge block 2323 is provided with a second arc-shaped elongated slot 2324. The first door panel 232 is further provided with a first guide sliding slot C1.

Figure 12:
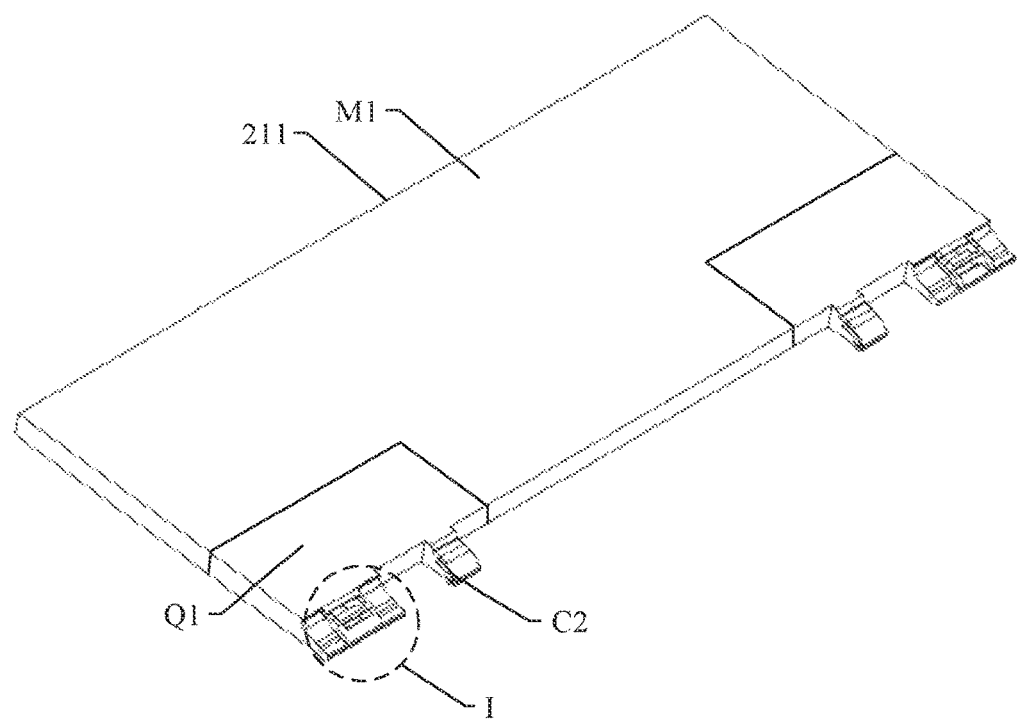
FIG. 12 is an assembly diagram of the first middle frame and the first connector in the assembly structure shown in FIG. 7.
Figure 13:
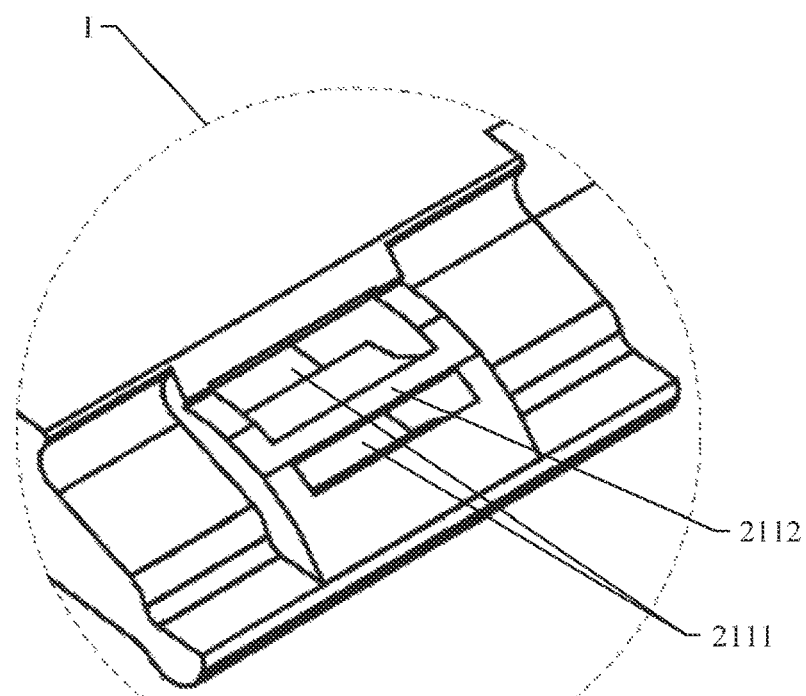
FIG. 13 is a partial enlarged view of a region I in the assembly diagram shown in FIG. 12.

FIG. 12 is a schematic diagram of an assembly structure of the first connector Q1 and the first middle frame 211 in the assembly structure shown in FIG. 7. The first connector Q1 is further provided with a second guide sliding slot C2. FIG. 13 is a partial enlarged view of a region I in the assembly diagram shown in FIG. 12. In this embodiment, the first connector Q1 is provided with a second hinge slot 2111. A second arc-shaped rib 2112 is disposed in the second hinge slot 2111.

The second hinge block 2323 in FIG. 11 is matched and accommodated in the second hinge slot 2111 in FIG. 13, and can rotate around a circle center line of the second arc-shaped elongated slot 2324 in the second hinge slot 2111. The second arc-shaped rib 2112 in FIG. 13 is matched and accommodated in the second arc-shaped elongated slot 2324 in FIG. 11. Therefore, hinging between the first connector Q1 and the first door panel 232 is implemented. This structure is simple and easy to implement.

The first connector Q1 is fixed to the first middle frame 211. Specifically, the first connector Q1 may be fixed to the first middle frame 211 in a manner such as screwing, riveting, or bonding, or may be integrally formed with the first middle frame 211.

Figure 14:
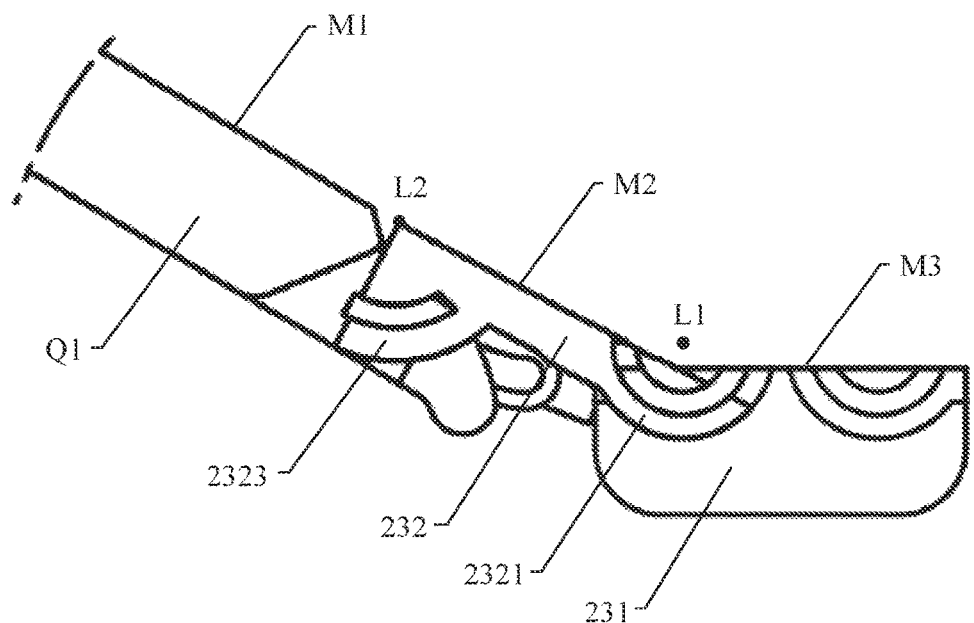
FIG. 14 is a cross-sectional view of the assembly structure shown in FIG. 7 at line A-A.

FIG. 14 is a cross-sectional view of the assembly structure shown in FIG. 7 at line A-A. A hinge axis between the first door panel 232 and the base 231 is a first hinge axis L1, and a hinge axis between the first connector Q1 and the first door panel 232 is a second hinge axis L2. The first hinge axis L1 is parallel to the second hinge axis L2. The base 231 and the first door panel 232 each have a lamination surface. Specifically, the first door panel 232 has a lamination surface M2, and the base 231 has a lamination surface M3. The lamination surface M2 and the lamination surface M3 are used for lamination to the third part 13 of the foldable screen 10.

Around the first hinge axis L1 and the second hinge axis L2, the first connector Q1 is capable of rotating between an unfolding position and a folding position relative to the base 231.

Figure 15:
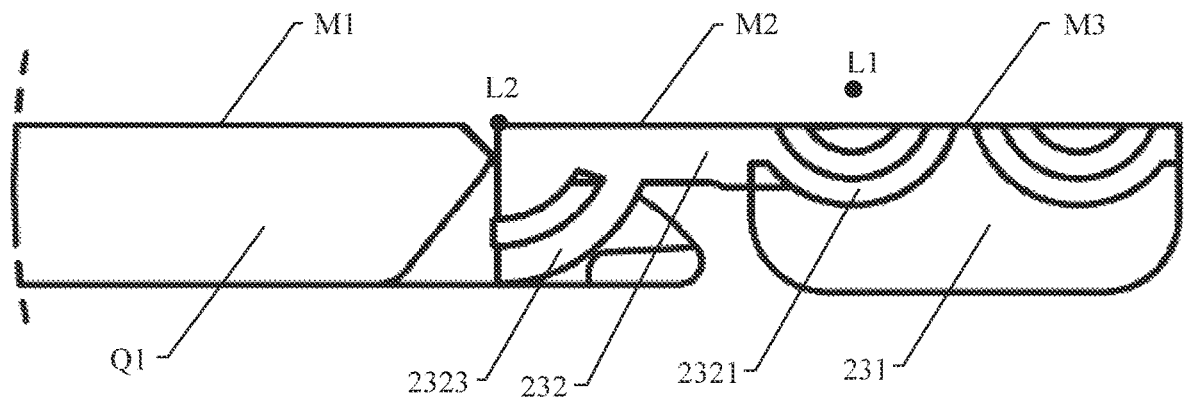
FIG. 15 is a schematic diagram of the structure shown in FIG. 14 when the first connector is at an unfolding position.

Specifically, FIG. 15 is a schematic diagram of the structure shown in FIG. 14 when the first connector Q1 is at an unfolding position. At this position, the lamination surface M1, the lamination surface M2, and the lamination surface M3 are coplanarly disposed. The lamination surface M1, the lamination surface M2, and the lamination surface M3 face a same direction. This position is the position of the first connector Q1 relative to the base 231 and the first door panel 232 when the foldable screen 10 is in the unfolded state.

Figure 16:
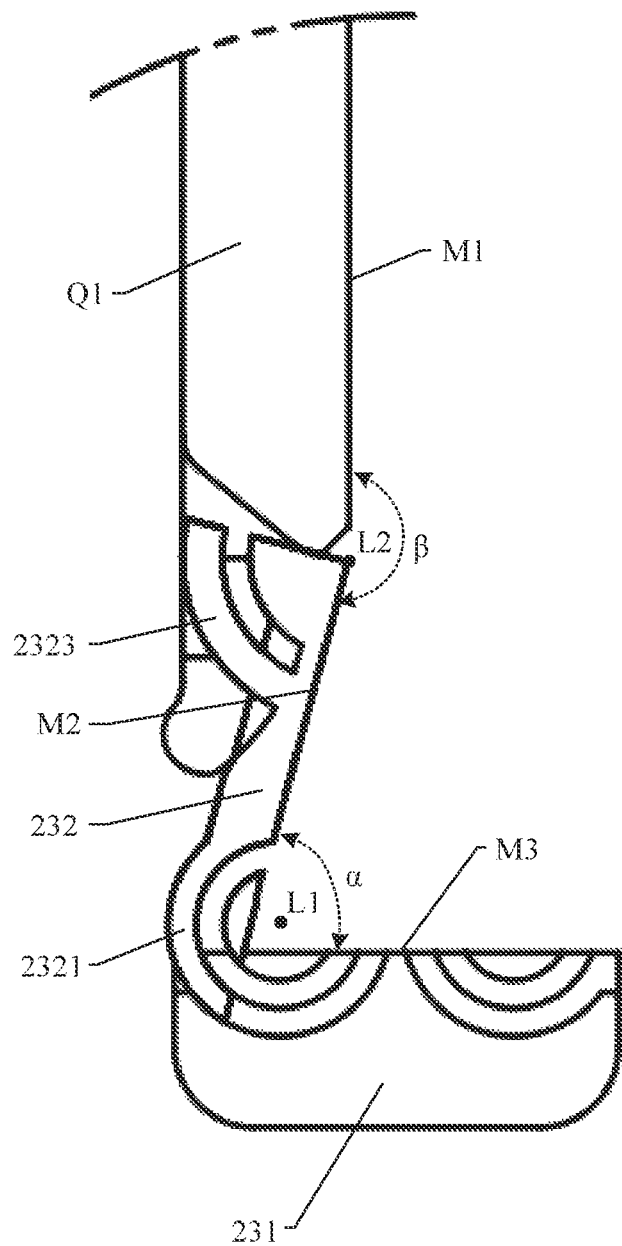
FIG. 16 is a schematic diagram of the structure shown in FIG. 14 when the first connector is at a folding position.

FIG. 16 is a schematic diagram of the structure shown in FIG. 14 when the first connector Q1 is at a folding position. At this position, the lamination surface M1 is perpendicular to the lamination surface M3. This state is the position of the first connector Q1 relative to the base 231 when the foldable screen 10 is in the folded state.

In some embodiments, referring to FIG. 14 to FIG. 16, the first hinge axis L1 is located on a side facing the lamination surface M3, and the first hinge axis L1 is spaced from the lamination surface M3. In this way, when the first connector Q1 rotates from the unfolding position to the folding position, the base 231 may be sunk to avoid the foldable screen 10, so that the foldable screen 10 has a relatively large inward folding angle, and the service life of the foldable screen 10 can be prolonged. When the first connector Q1 rotates from the folding position to the unfolding position, the base 231 may be lifted, so that the lamination surface M3 of the base 231 is flush with the lamination surface M1 and the lamination surface M2, to ensure that the foldable screen 10 is flat.

In some embodiments, referring to FIG. 14 to FIG. 16, the second hinge axis L2 coincides with an edge (that is, a second edge b described below) of the lamination surface M2 close to the lamination surface M1. In this way, when the first connector Q1 moves between the unfolding position and the folding position, a relative position between the edge of the lamination surface M2 close to the lamination surface M1 and the lamination surface M1 is fixed, so that the foldable screen 10 is not damaged, thereby prolonging the service life of the foldable screen 10.

The first swing arm 233 is configured to control a movement state of the first door panel 232 when the first connector Q1 rotates between the unfolding position and the folding position, so that when the first connector Q1 is at the folding position, referring to FIG. 16, an included angle between the lamination surface M2 and the lamination surface M3 on a side for lamination to the foldable screen 10 is α, α is less than 90°, an included angle between the lamination surface M2 and the lamination surface M1 on the side for lamination to the foldable screen 10 is β, β is greater than 180°, and the lamination surface M1 is perpendicular or approximately perpendicular to the lamination surface M3. α+β is approximately equal to 270°. In this way, the foldable screen part attached to the lamination surface M1, the lamination surface M3, and the lamination surface M2 may be folded into a water drop shape, so as to increase an inward folding angle (R angle) of the foldable screen 10 and prolong the service life of the foldable screen 10. Optionally, α is greater than or equal to 650 and less than or equal to 82°. In this way, the included angle α is moderate, which can increase the R angle of the bent region of the foldable screen 10 and effectively prolong the service life of the foldable screen 10.

Figure 17:
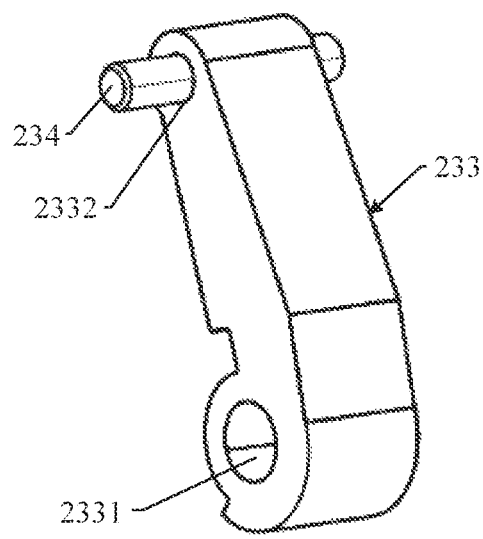
FIG. 17 is a schematic diagram of a structure of the first swing arm in the assembly structure shown in FIG. 7.
Figure 18:
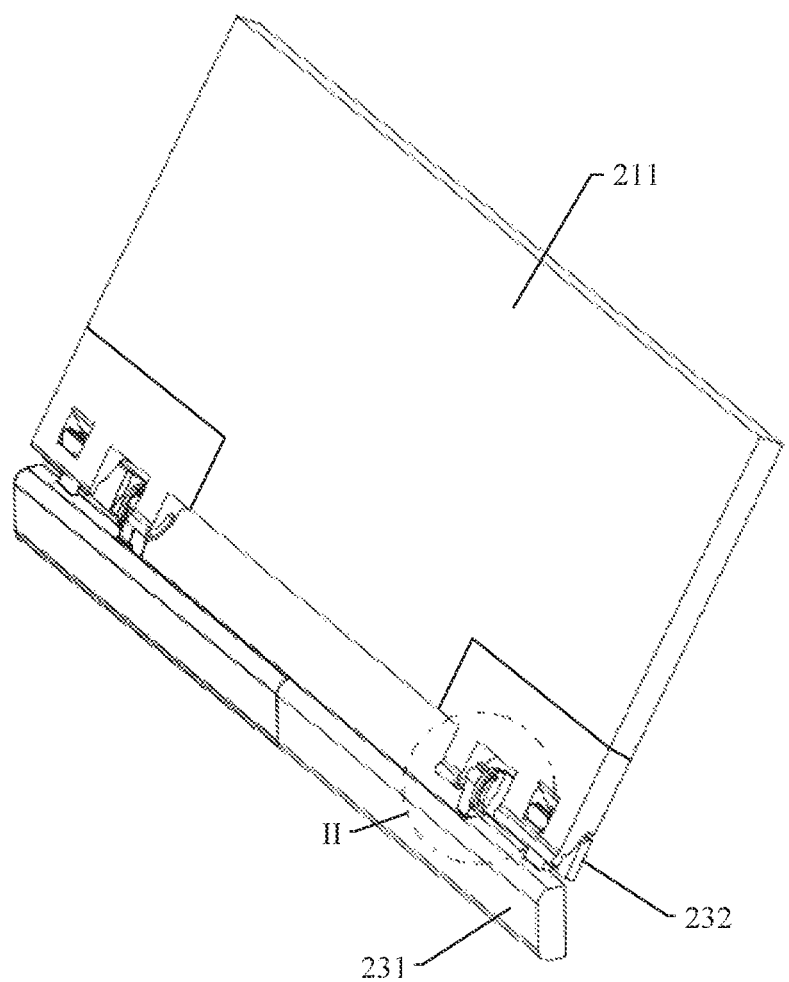
FIG. 18 is a schematic diagram of a structure of the assembly structure shown in FIG. 7 at another view angle.
Figure 19:
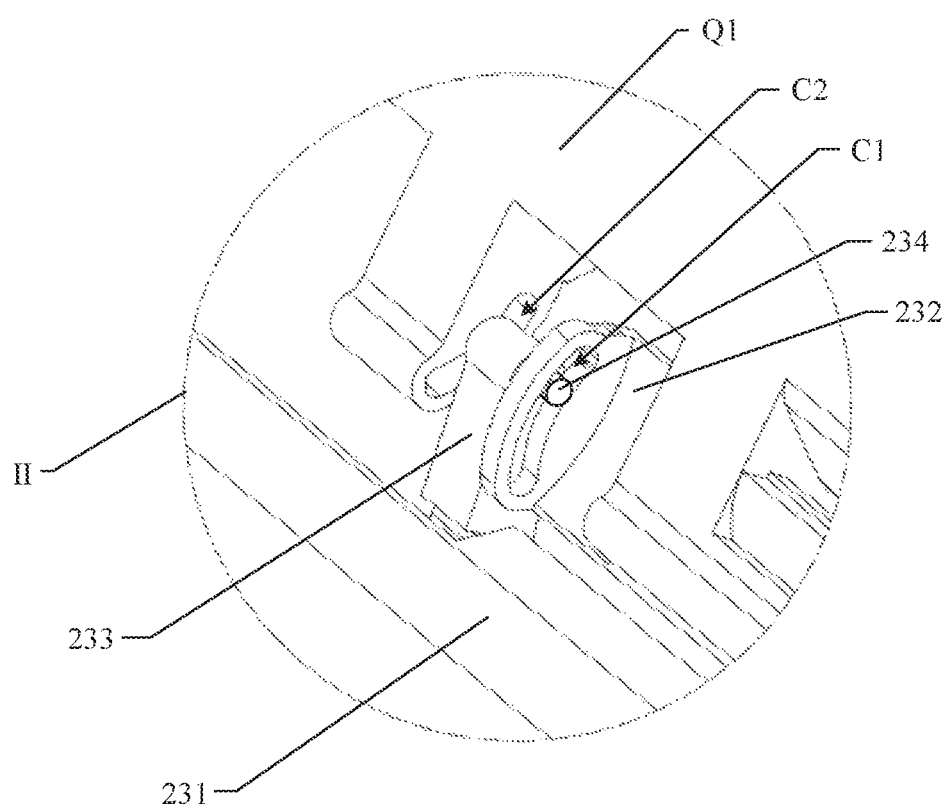
FIG. 19 is a partial enlarged view of a region II in FIG. 18.

To achieve the foregoing objective, specifically, an end of the first swing arm 233 is hinged to the base 231. In some embodiments, FIG. 17 is a schematic diagram of a structure of the first swing arm 233 in the assembly structure shown in FIG. 7. One end of the first swing arm 233 is provided with a hinge hole 2331. The first swing arm 233 is hinged to a hinge shaft 2313 (see FIG. 9) of the base 231 through the hinge hole 2331. The other end of the first swing arm 233 is provided with a first sliding member 234. In some embodiments, the first sliding member 234 is a pin shaft. In another embodiment, the first sliding member 234 may alternatively be a roller. The first sliding member 234 is in interference fit inside a mounting hole 2332 of the first swing arm 233. FIG. 18 is a schematic diagram of a structure of the assembly structure shown in FIG. 7 at another view angle, and FIG. 19 is a partial enlarged view of a region II in FIG. 18. The first sliding member 234 is slidably connected inside the first guide sliding slot C1 of the first door panel 232 and the second guide sliding slot C2 of the first connector Q1.

When the first connector Q1 rotates between the unfolding position and the folding position relative to the base 231, the second guide sliding slot C2 may push the first sliding member 234, so that the first sliding member 234 slides along the first guide sliding slot C1 and the second guide sliding slot C2, thereby driving the first door panel 232 to move together with the first connector Q1. Therefore, an objective of controlling the movement state of the first door panel 232 is achieved.

Figure 20:
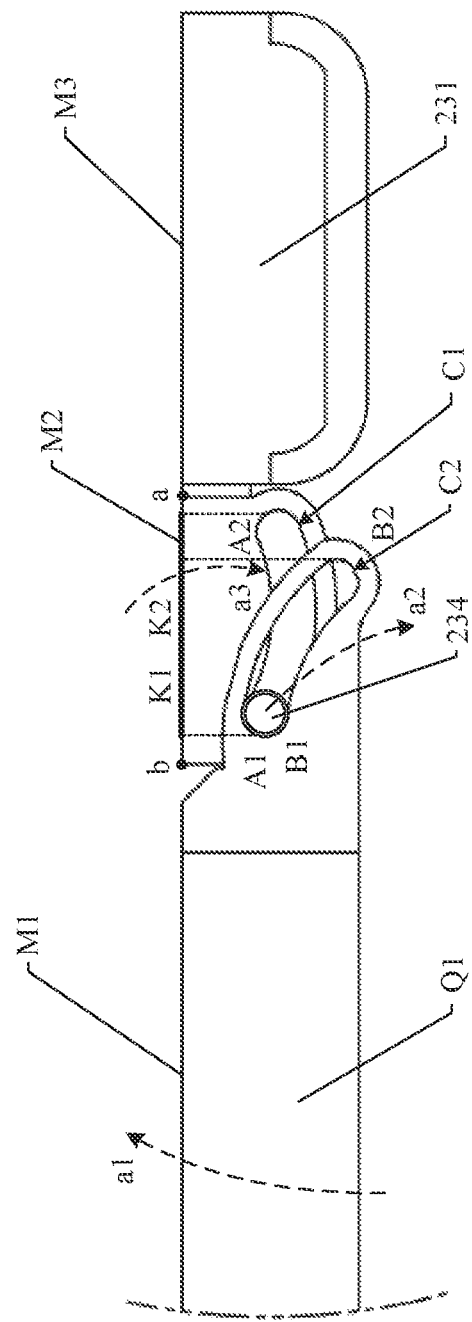
FIG. 20 is a schematic diagram of relative positions of a first sliding member, a first guide sliding slot, a second guide sliding slot, a lamination surface of a base, a lamination surface of a first door panel, and a lamination surface of a first middle frame when a first connector is at an unfolding position.
Figure 21:
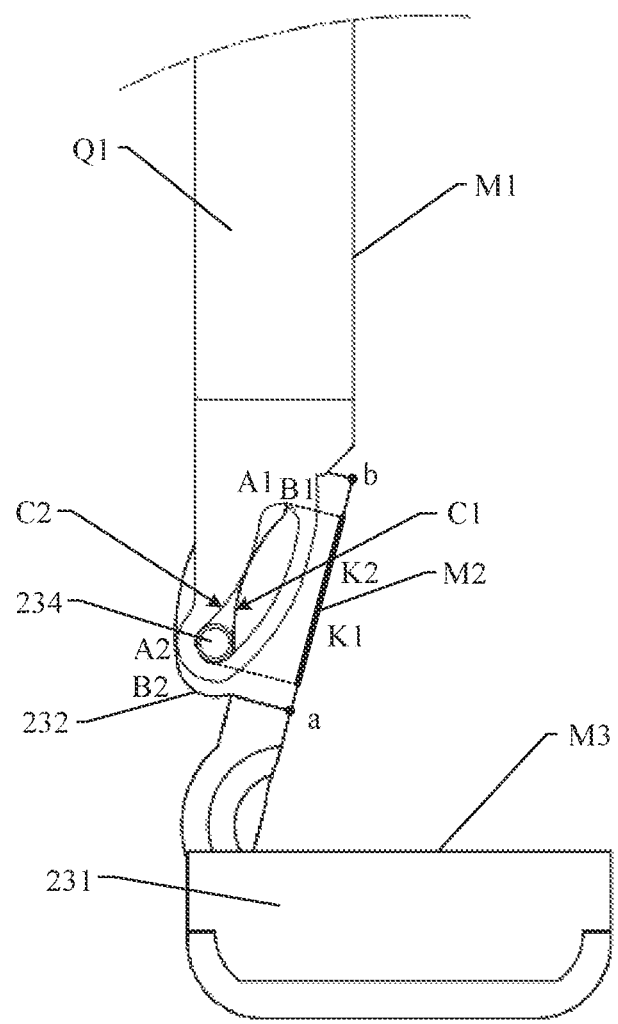
FIG. 21 is a schematic diagram of relative positions of a first sliding member, a first guide sliding slot, a second guide sliding slot, a lamination surface of a base, a lamination surface of a first door panel, and a lamination surface of a first middle frame when a first connector is at a folding position.

FIG. 20 is a schematic diagram of relative positions of a first sliding member 234, a first guide sliding slot C1, a second guide sliding slot C2, a lamination surface M3, a lamination surface M2, and a lamination surface M1 when a first connector Q1 is at an unfolding position; and FIG. 21 is a schematic diagram of relative positions of a first sliding member 234, a first guide sliding slot C1, a second guide sliding slot C2, a lamination surface M3, a lamination surface M2, and a lamination surface M1 when a first connector Q1 is at a folding position. In this embodiment, the first guide sliding slot C1 and the second guide sliding slot C2 are located on a side of a plane in which the lamination surface M2 is located and that is away from the foldable screen 10. An orthographic projection of the first guide sliding slot C1 on the lamination surface M2 is a first projection K1. An orthographic projection of the second guide sliding slot C2 on the lamination surface M2 is a second projection K2. An edge of the lamination surface M2 close to the lamination surface M3 is a first edge a, and an edge of the lamination surface M2 close to the lamination surface M1 is a second edge b. The first projection K1 and the second projection K2 are located between a straight line at which the first edge a is located and a straight line at which the second edge b is located. In this way, the rotating mechanism 23 has a simple structure and a relatively small volume. In addition, the first guide sliding slot C1 and the second guide sliding slot C2 do not interfere with the foldable screen 10.

On the basis of the foregoing embodiment, optionally, still referring to FIG. 20 and FIG. 21, two ends of the first guide sliding slot C1 are a first end A1 and a second end A2, respectively. The first guide sliding slot C1 extends from the first end A1 to the second end A2 in a direction close to the base 231. Two ends of the second guide sliding slot C2 are a third end B1 and a fourth end B2, respectively. The second guide sliding slot C2 extends from the third end B1 to the fourth end B2 in a direction close to the base 231. When the first connector Q1 rotates from the unfolding position to the folding position, the first sliding member 234 slides from the first end A1 of the first guide sliding slot C1 and the third end B1 of the second guide sliding slot C2 to the second end A2 of the first guide sliding slot C1 and the fourth end B2 of the second guide sliding slot C2. In this way, the first connector Q1 can rotate from the unfolding position to the folding position more smoothly, and it is easier to unfold and fold the electronic device.

On the basis of the foregoing embodiment, optionally, referring to FIG. 20 and FIG. 21, the second guide sliding slot C2 extends from the third end B1 to the fourth end B2 in a direction away from a plane at which the lamination surface M1 is located. That is, when the second guide sliding slot C2 slides from the third end B1 to the fourth end B2, a perpendicular distance between the second guide sliding slot C2 and the plane at which the lamination surface M1 is located increases. In this way, referring to FIG. 20, during rotation of the first connector Q1 from the unfolding position to the folding position in a direction a1, the second guide sliding slot C2 may push the first sliding member 234 to gradually move in a direction away from the foldable screen 10 (that is, a direction a2), thereby driving one end of the first door panel 232 close to the base 231 to be gradually inclined in a direction away from the foldable screen 10 (that is, a direction a3) relatively to the other end of the first door panel 232 close to the first connector Q1. In this way, the first connector gradually rotates to the folding position. The structure is simple, and a driving force applied to the first middle frame 211 can be directly transmitted to the first sliding member 234 to push the first door panel 232 to slantly move, so that the folding driving force of the electronic device 100 is relatively strong, and a probability of jamming is relatively low.

In the foregoing embodiment, the second guide sliding slot C2 may extend along a straight line or along an arc. This is not specifically limited herein. In the embodiments shown in FIG. 20 and FIG. 21, the second guide sliding slot C2 is an arc-shaped sliding slot. That is, the second guide sliding slot C2 extends along an arc. An extension path of the second guide sliding slot C2 is arched in a direction close to the lamination surface M2. In this way, during the rotation of the first connector Q1 from the unfolding position to the folding position in the direction a1, the second guide sliding slot C2 may control an inclination angle of the first door panel 232 to change smoothly, thereby improving folding stability of the electronic device 100 and reducing the probability of jamming.

On the basis of the foregoing embodiment, the first guide sliding slot C1 may extend along a straight line or along an arc. This is not specifically limited herein. Optionally, referring to FIG. 20 and FIG. 21, the first guide sliding slot C1 is an arc-shaped sliding slot. That is, the first guide sliding slot C1 also extends along an arc. An extension path of the first guide sliding slot C1 is arched in a direction away from the lamination surface M2. In this way, during the rotation of the first connector Q1 from the unfolding position to the folding position in the direction a1, the second guide sliding slot C2 matches the first guide sliding slot C1, so that the inclination angle of the first door panel 232 may be controlled to change gently, and stress is stable, thereby further improving folding stability of the electronic device 100 and reducing the probability of jamming.

Figure 22:
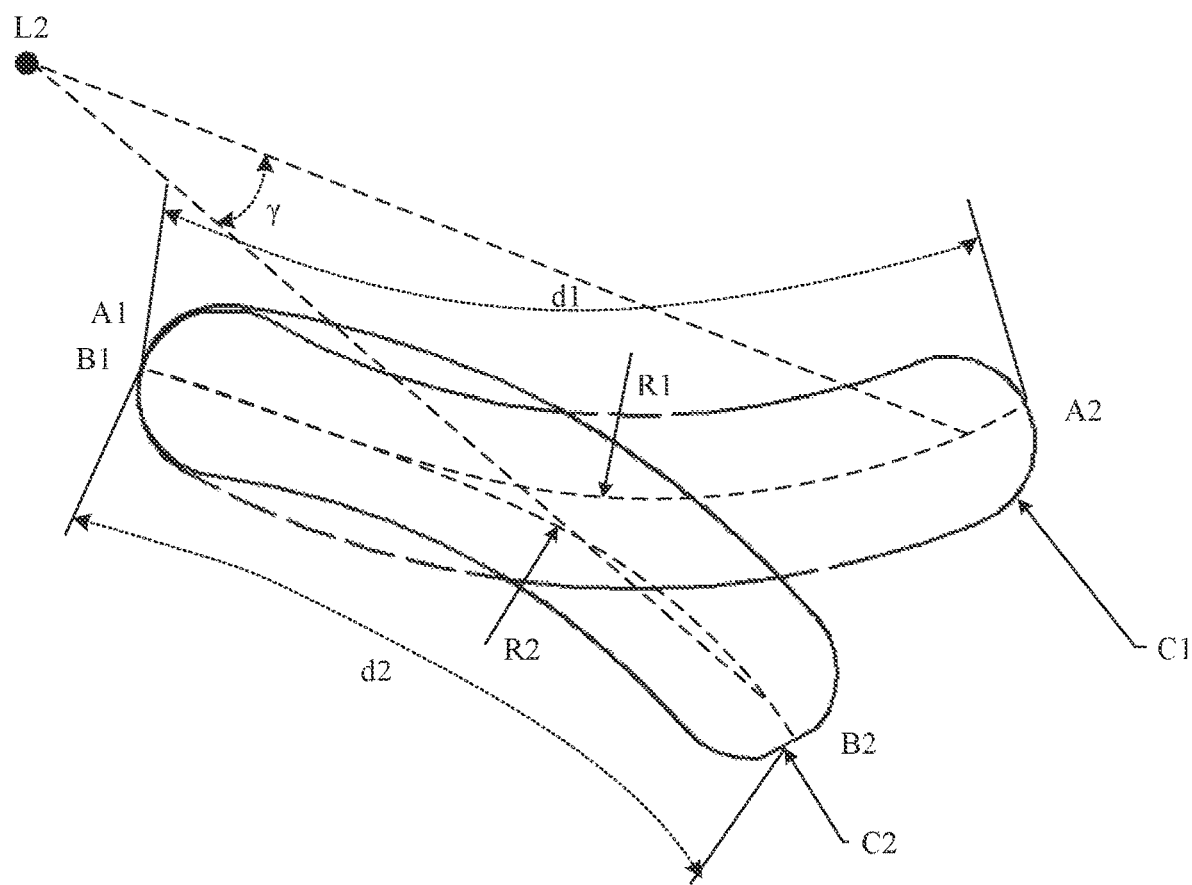
FIG. 22 is a diagram showing a relationship between a first guide sliding slot, a second guide sliding slot, and a second hinge axis when a first connector is at an unfolding position.

In some embodiments, FIG. 22 is a diagram showing a relationship between a first guide sliding slot C1, a second guide sliding slot C2, and a second hinge axis L2 when a first connector Q1 is at an unfolding position. The first guide sliding slot C1 has a length of d1 along an extension path thereof, and the second guide sliding slot C2 has a length of d2 along an extension path thereof d1 and d2 each are in a range of [3.5 mm, 10 mm]. Further, optionally, d1 and d2 each are in a range of [3.5 mm, 5 mm].

In some embodiments, still referring to FIG. 22, the first guide sliding slot C1 has a curvature radius of R1 at each position along the extension path thereof, the second guide sliding slot C2 has a curvature radius of R2 at each position along the extension path thereof, and R1 and R2 each are in a range of [3 mm, 7 mm]. Further, optionally, R1 and R2 each are in a range of [4 mm, 5.5 mm].

In some embodiments, when the first connector Q1 is at the unfolding position, still referring to FIG. 22, an included angle between a vertical line from the second end A2 to the second hinge axis L2 and a vertical line from the fourth end B2 to the second hinge axis L2 is γ. γ=90°−α=−180°. For a and R, refer to FIG. 16.

Referring to FIG. 6 again, the rotating mechanism 23 further includes a second door panel 235, a second connector Q2, and a second swing arm 236. The second door panel 235 is located between the base 231 and the second connector Q2. The second door panel 235 is hinged to the base 231. The second connector Q2 is hinged to the second door panel 235. The second connector Q2 is fixed to the second middle frame 221. The second door panel 235 has a lamination surface, and the lamination surface is used for lamination to the foldable screen 10. The second door panel 235 is provided with a third guide sliding slot. The second connector Q2 is provided with a fourth guide sliding slot. One end of the second swing arm 236 is hinged to the base 231, the other end of the second swing arm 236 is provided with a second sliding member, and the second sliding member is slidably connected inside the third guide sliding slot and the fourth guide sliding slot. The second connector Q2 is capable of rotating between an unfolding position and a folding position relative to the base 231. When the second connector Q2 is at the unfolding position, the lamination surface of the base 231, the lamination surface of the second door panel 235, and the lamination surface of the second middle frame 221 are coplanar and face a same direction.

When the second connector Q2 is at the folding position, an included angle between the lamination surface of the base 231 and the lamination surface of the second door panel 235 on a side for lamination to the foldable screen 10 is less than 90°, an included angle between the lamination surface of the second door panel 235 and the lamination surface of the second middle frame 221 on a side for lamination to the foldable screen 10 is greater than 180°, and the lamination surface of the second middle frame 221 is perpendicular or approximately perpendicular to the lamination surface of the base 231. Specifically, a structural form and assembly and movement manners of the second door panel 235, the second connector Q2, the second swing arm 236, the third guide sliding slot, the fourth guide sliding slot, and the second sliding member are the same as those of the first door panel 232, the first connector Q1, the first swing arm 233, the first guide sliding slot C1, the second guide sliding slot C2, and the first sliding member 234. Details are not described herein again. In this way, the support apparatus 20 may fold the third part 13 of the foldable screen 10 into a water drop shape, and the inward folding angle (R angle) of the third part 13 is relatively large, so that the service life of the foldable screen 10 is relatively long.

Figure 23:
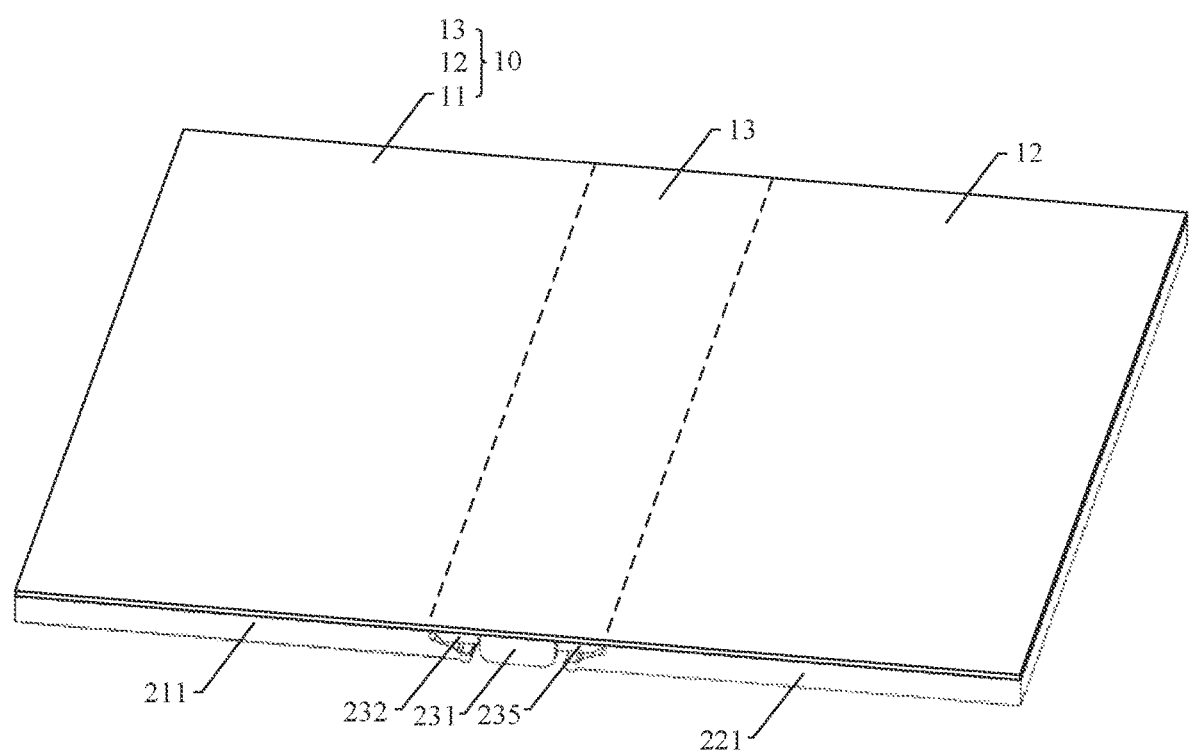
FIG. 23 is a schematic diagram of a structure when the assembly structure shown in FIG. 6 and a foldable screen are in an unfolded state.

FIG. 23 is a schematic diagram of a structure when the assembly structure shown in FIG. 6 and a foldable screen 10 are in an unfolded state. In this state, a lamination surface of the first middle frame 211, a lamination surface of a first door panel 232, a lamination surface of a base 231, a lamination surface of a second door panel 235, and a lamination surface of a second middle frame 221 are coplanarly disposed. A first part 11 of the foldable screen 10 is supported and fixed to the lamination surface of the first middle frame 211. A second part 12 of the foldable screen 10 is supported and fixed to the lamination surface of the second middle frame 221. A third part 13 of the foldable screen 10 is supported and fixed to the lamination surface of the first door panel 232 and the lamination surface of the second door panel 235. The third part 13 of the foldable screen 10 is further supported on the lamination surface of the base 231.

Figure 24:
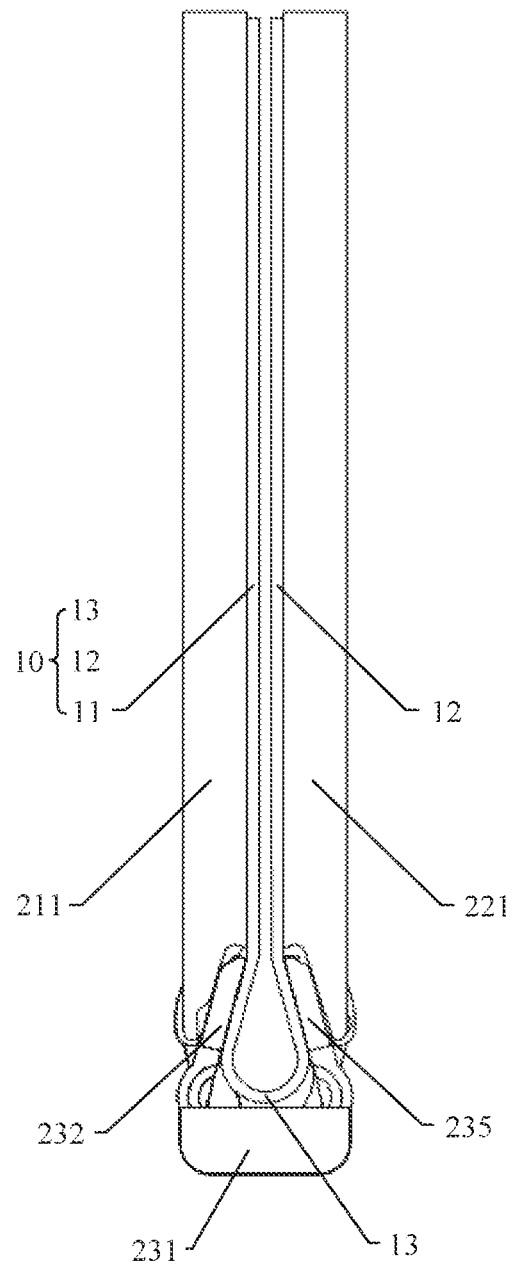
FIG. 24 is a schematic diagram of a structure when the assembly structure shown in FIG. 6 and a foldable screen are in a folded state.

FIG. 24 is a schematic diagram of a structure when the assembly structure shown in FIG. 6 and a foldable screen 10 are in a folded state. In this state, the lamination surface of the first middle frame 211 is opposite to the lamination surface of the second middle frame 221. The lamination surface of the first middle frame 211 and the lamination surface of the second middle frame 221 are perpendicular to the lamination surface of the base 231. The lamination surface of the first door panel 232 is inclined in a direction away from the foldable screen 10 from an end close to the lamination surface of the first middle frame 211 to an end close to the lamination surface of the base 231. The lamination surface of the second door panel 235 is inclined in a direction away from the foldable screen 10 from an end close to the lamination surface of the second middle frame 221 to an end close to the lamination surface of the base 231. A first part 11 of the foldable screen 10 is supported and fixed to the lamination surface of the first middle frame 211. A second part 12 of the foldable screen 10 is supported and fixed to the lamination surface of the second middle frame 221. A third part 13 of the foldable screen 10 is supported and fixed to the lamination surface of the first door panel 232 and the lamination surface of the second door panel 235. The third part 13 of the foldable screen 10 is in a water drop shape. The inward folding angle (R angle) of the third part 13 is relatively large, so that the service life of the foldable screen 10 is relatively long.

In this embodiment of this application, it should be noted that the rotating mechanism 23 may directly fix the second housing 22 to the base 231 without including the second door panel 233, the third connector Q1, the second guide sliding slot, the fourth guide sliding slot, and the second swing arm 236, and make the lamination surface of the second housing 22 perpendicular or approximately perpendicular to the lamination surface M3 of the base 231, so as to implement 900 opening and closing and folding.

Because the support apparatus 20 according to the embodiments of this application includes the rotating mechanism 23 according to any one of the foregoing technical solutions, the support apparatus and the rotating mechanism can resolve a same technical problem and achieve a same effect.

Because the electronic device 100 according to the embodiments of this application includes the support apparatus 20 according to any one of the foregoing embodiments, the electronic device and the support apparatus can resolve a same technical problem and achieve a same effect.

In description of this specification, specific features, structures, materials or characteristics described may be combined in any one or more embodiments or examples in a suitable manner.

Finally, it should be noted that the foregoing embodiments are only used to illustrate the technical solutions of this application, but are not used to limit this application. Although this application has been described in detail with reference to the foregoing embodiments, it should be understood by a person of ordinary skill in the art that the technical solutions described in the foregoing embodiments may still be modified, or some technical features thereof are equivalently replaced. These modifications or replacements do not make the essence of the corresponding technical solutions depart from the spirit and scope of the technical solutions of the embodiments of this application.

What is claimed is:

1. A rotating mechanism structure, comprising:
   a base;
   a first door panel;
   a first connector; and
   a first swing arm,
   wherein the first door panel is hinged to the base, the first connector is hinged to the first door panel, and the first connector is configured to be fixed to a first housing;
   wherein the first door panel is provided with a first guide sliding slot, the first connector is provided with a second guide sliding slot, one end of the first swing arm is hinged to the base, the other end of the first swing arm is provided with a first sliding member, and the first sliding member is slidably connected inside the first guide sliding slot and the second guide sliding slot;
   wherein each of the base, the first door panel, and the first housing has a lamination surface, and the lamination surface is used for lamination to a foldable screen; and
   wherein the first connector is capable of rotating between an unfolding position and a folding position relative to the base, such that based on the first connector is being at the unfolding position, the lamination surface of the base, the lamination surface of the first door panel, and the lamination surface of the first housing are coplanar and face a same direction, and based on the first connector is being at the folding position, an included angle between the lamination surface of the base and the lamination surface of the first door panel on a side for lamination to the foldable screen is less than 90°, an included angle between the lamination surface of the first door panel and the lamination surface of the first housing on the side for lamination to the foldable screen is greater than 180°, and the lamination surface of the first housing is perpendicular to the lamination surface of the base.

2. The rotating mechanism structure according to claim 1,
   wherein the first guide sliding slot and the second guide sliding slot are located on a side of the lamination surface of the first door panel away from the foldable screen; and
   wherein an orthographic projection of the first guide sliding slot on the lamination surface of the first door panel is a first projection, an orthographic projection of the second guide sliding slot on the lamination surface of the first door panel is a second projection, an edge of the lamination surface of the first door panel close to the lamination surface of the base is a first edge, an edge of the lamination surface of the first door panel close to the lamination surface of the first housing is a second edge, and the first projection and the second projection are located between a straight line at which the first edge is located and a straight line at which the second edge is located.

3. The rotating mechanism structure according to claim 2,
   wherein two ends of the first guide sliding slot are a first end and a second end, respectively, and the first guide sliding slot extends from the first end to the second end in a direction close to the base;
   wherein two ends of the second guide sliding slot are a third end and a fourth end, respectively, and the second guide sliding slot extends from the third end to the fourth end in a direction close to the base; and
   wherein based on the first connector rotating from the unfolding position to the folding position, the first sliding member slides from the first end of the first guide sliding slot and the third end of the second guide sliding slot to the second end of the first guide sliding slot and the fourth end of the second guide sliding slot.

4. The rotating mechanism structure according to claim 3, wherein the second guide sliding slot extends from the third end to the fourth end in a direction away from a plane at which the lamination surface of the first housing is located.

5. The rotating mechanism structure according to claim 4, wherein the second guide sliding slot is an arc-shaped sliding slot, and an extension path of the second guide sliding slot is arched in a direction close to the lamination surface of the first door panel.

6. The rotating mechanism structure according to claim 5, wherein the first guide sliding slot is an arc-shaped sliding slot, and an extension path of the first guide sliding slot is arched in a direction away from the lamination surface of the first door panel.

7. The rotating mechanism structure according to claim 6, wherein each of the first guide sliding slot and the second guide sliding slot has a length range of [3.5 mm, 10 mm] along an extension path thereof.

8. The rotating mechanism structure according to claim 6, wherein each of the first guide sliding slot and the second guide sliding slot has a curvature radius range of [3 mm, 7 mm] at each position on the extension path thereof.

9. The rotating mechanism structure according to claim 2,
   wherein a hinge axis between the first connector and the first door panel is a second hinge axis; and
   wherein the second hinge axis coincides with the second edge.

10. The rotating mechanism structure according to claim 1, wherein based on the first connector is being at the folding position, the included angle between the lamination surface of the base and the lamination surface of the first door panel on the side for lamination to the foldable screen is greater than or equal to 65° and less than or equal to 82°.

11. The rotating mechanism structure according to claim 1,
wherein the base is provided with a first hinge slot, and a first arc-shaped rib is arranged in the first hinge slot;
wherein the first door panel is provided with a first hinge block, and the first hinge block is provided with a first arc-shaped elongated slot; and
wherein the first hinge block is matched and accommodated in the first hinge slot, and the first arc-shaped rib is matched and embedded in the first arc-shaped elongated slot.

12. The rotating mechanism structure according to claim 1,
wherein the first door panel is provided with a second hinge block, and the second hinge block is provided with a second arc-shaped elongated slot;
wherein the first connector is provided with a second hinge slot, and a second arc-shaped rib is arranged in the second hinge slot; and
wherein the second hinge block is matched and accommodated in the second hinge slot, and the second arc-shaped rib is matched and accommodated in the second arc-shaped elongated slot.

13. The rotating mechanism structure according to claim 1,
wherein a hinge axis between the first door panel and the base is a first hinge axis; and
wherein the first hinge axis is located on the side that the lamination surface of the base faces, and is spaced from the lamination surface of the base.

14. The rotating mechanism structure according to claim 1, further comprising:
a second door panel;
a second connector; and
a second swing arm,
wherein the second door panel is hinged to the base, the second connector is hinged to the second door panel, and the second connector is configured to be fixed to a second housing;
wherein the second door panel is provided with a third guide sliding slot, the second connector is provided with a fourth guide sliding slot, one end of the second swing arm is hinged to the base, the other end of the second swing arm is provided with a second sliding member, and the second sliding member is slidably connected inside the third guide sliding slot and the fourth guide sliding slot;
wherein each of the second door panel and the second housing has a lamination surface, and the lamination surface is used for lamination to the foldable screen; and
wherein the second connector is capable of rotating between an unfolding position and a folding position relative to the base, such that based on the second connector is being at the unfolding position, the lamination surface of the base, the lamination surface of the second door panel, and the lamination surface of the second housing are coplanar and face a same direction, and based on the second connector is being at the folding position, an included angle between the lamination surface of the base and the lamination surface of the second door panel on a side for lamination to the foldable screen is less than 90°, an included angle between the lamination surface of the second door panel and the lamination surface of the second housing on a side for lamination to the foldable screen is greater than 180°, and the lamination surface of the second housing is perpendicular to the lamination surface of the base.

15. A support apparatus, comprising: the first housing, a second housing, and the rotating mechanism structure according to claim 1, wherein the rotating mechanism structure is located between the first housing and the second housing, the first connector of the rotating mechanism structure is fixed to the first housing, and the base of the rotating mechanism structure is connected to the second housing.

16. An electronic device, comprising the foldable screen, and the support apparatus according to claim 15, wherein the foldable screen comprises a first part, a second part, and a third part, wherein the third part is located between the first part and the second part; and wherein the first part is supported and fixed to the lamination surface of the first housing of the support apparatus, the second part is supported and fixed to a lamination surface of the second housing of the support apparatus, and the third part is supported and fixed to the rotating mechanism structure of the support apparatus.

\* \* \* \* \*

UNITED STATES PATENT AND TRADEMARK OFFICE
CERTIFICATE OF CORRECTION

PATENT NO. : 12,169,425 B2
APPLICATION NO. : 17/914130
DATED : December 17, 2024
INVENTOR(S) : Zhang et al.

Page 1 of 1

It is certified that error appears in the above-identified patent and that said Letters Patent is hereby corrected as shown below:

In the Claims

Claim 1, Column 15, Line 58: "the base, such that based on the first connector is being" should read -- the base, such that based on the first connector being --.

Claim 1, Column 15, Line 63: "connector is being at the folding position, an included" should read -- connector being at the folding position, an included --.

Claim 10, Column 16, Line 67: "1, wherein based on the first connector is being at the folding" should read -- 1, wherein based on the first connector being at the folding --.

Claim 14, Column 18, Line 12: "connector is being at the unfolding position, the lami-" should read -- connector being at the unfolding position, the lami- --.

Claim 14, Column 18, Line 16: "and based on the second connector is being at the" should read -- and based on the second connector being at the --.

Signed and Sealed this
Eighteenth Day of February, 2025

Coke Morgan Stewart
*Acting Director of the United States Patent and Trademark Office*